(12) United States Patent
Okada et al.

(10) Patent No.: US 10,386,684 B2
(45) Date of Patent: Aug. 20, 2019

(54) SEMICONDUCTOR DEVICE, DISPLAY APPARATUS, AND METHOD OF MANUFACTURING SEMICONDUCTOR DEVICE

(71) Applicant: Sharp Kabushiki Kaisha, Sakai, Osaka (JP)

(72) Inventors: Kuniaki Okada, Sakai (JP); Seiichi Uchida, Sakai (JP); Naoki Ueda, Sakai (JP); Sumio Katoh, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 173 days.

(21) Appl. No.: 15/534,197

(22) PCT Filed: Dec. 14, 2015

(86) PCT No.: PCT/JP2015/084915
§ 371 (c)(1),
(2) Date: Jun. 8, 2017

(87) PCT Pub. No.: WO2016/140216
PCT Pub. Date: Jun. 30, 2016

(65) Prior Publication Data
US 2018/0259820 A1    Sep. 13, 2018

(30) Foreign Application Priority Data
Dec. 26, 2014 (JP) .................. 2014-264801

(51) Int. Cl.
*G02F 1/1368* (2006.01)
*G02F 1/1362* (2006.01)
(Continued)

(52) U.S. Cl.
CPC ...... *G02F 1/136227* (2013.01); *G02F 1/1337* (2013.01); *G02F 1/1368* (2013.01);
(Continued)

(58) Field of Classification Search
CPC ............ G02F 1/1368; G02F 1/136286; G02F 1/136227; G02F 1/13439; G02F 1/1337;
(Continued)

(56) References Cited

U.S. PATENT DOCUMENTS

2002/0109799 A1* 8/2002 Choi ................ G02F 1/136213
349/43
2004/0238825 A1  12/2004 Lim et al.
(Continued)

FOREIGN PATENT DOCUMENTS

JP          4883878 B      12/2011
JP       2013105136 A       5/2013
(Continued)

*Primary Examiner* — Hoan C Nguyen
(74) *Attorney, Agent, or Firm* — ScienBiziP, P.C.

(57) ABSTRACT

A semiconductor device (100A) includes a thin film transistor (10), an inter-layer insulation layer (22) covering the thin film transistor, and a transparent conductive layer (24) formed on the inter-layer insulation layer. The metal oxide layer (16) of the thin film transistor includes a first portion (16a) overlapping the gate electrode (12) via a gate insulation layer (14) and a second portion (16b) not overlapping the gate electrode (12). The second portion (16b) crosses a different edge (e2) different from an edge (e1) of the drain electrode (18d) on a side of the first portion when viewed in the normal direction of the substrate (11). The inter-layer insulation layer has a contact hole (22a) disposed to overlap a part of the drain electrode (18d) and at least a part of the second portion (16b) of the metal oxide layer when viewed in the normal direction of the substrate. The transparent conductive layer (24) comes into contact with the drain electrode (18d), the second portion (16b), and the gate insulation layer (14) in the contact hole (22a).

2 Claims, 15 Drawing Sheets

(51) Int. Cl.
*H01L 29/786* (2006.01)
*G02F 1/1333* (2006.01)
*G02F 1/1337* (2006.01)
*G02F 1/1343* (2006.01)
*H01L 21/02* (2006.01)
*H01L 27/12* (2006.01)
*H01L 29/24* (2006.01)
*H01L 29/66* (2006.01)

(52) U.S. Cl.
CPC .... *G02F 1/13439* (2013.01); *G02F 1/133345* (2013.01); *G02F 1/136286* (2013.01); *H01L 21/02565* (2013.01); *H01L 27/124* (2013.01); *H01L 27/127* (2013.01); *H01L 27/1225* (2013.01); *H01L 27/1248* (2013.01); *H01L 27/1262* (2013.01); *H01L 29/24* (2013.01); *H01L 29/66969* (2013.01); *H01L 29/786* (2013.01); *H01L 29/7869* (2013.01); *G02F 2001/136295* (2013.01); *G02F 2201/40* (2013.01); *G02F 2202/10* (2013.01)

(58) Field of Classification Search
CPC .......... G02F 1/133345; G02F 2202/10; G02F 2201/40; G02F 2001/136295; H01L 29/24; H01L 29/66969; H01L 29/7869; H01L 27/127; H01L 27/1262; H01L 27/1248; H01L 27/124; H01L 27/1225; H01L 21/02565; H01L 29/786
USPC .......................................................... 349/43
See application file for complete search history.

(56) References Cited

U.S. PATENT DOCUMENTS

| 2008/0303030 | A1* | 12/2008 | Sakai | H01L 27/1214 |
| | | | | 257/72 |
| 2011/0198606 | A1* | 8/2011 | Oda | H01L 29/04 |
| | | | | 257/72 |
| 2013/0214272 | A1 | 8/2013 | Nakatani et al. | |
| 2013/0320334 | A1 | 12/2013 | Yamazaki et al. | |
| 2014/0009711 | A1* | 1/2014 | Tomioka | G02F 1/134363 |
| | | | | 349/43 |
| 2014/0139774 | A1* | 5/2014 | Tsai | H01L 27/3258 |
| | | | | 349/43 |
| 2014/0319515 | A1 | 10/2014 | Nagayama et al. | |
| 2016/0380006 | A1* | 12/2016 | Uchida | H01L 27/1225 |
| | | | | 257/43 |

FOREIGN PATENT DOCUMENTS

| JP | 2014007399 A | 1/2014 |
| JP | 2014215485 A | 11/2014 |
| WO | 2012/004958 A | 1/2012 |

* cited by examiner (a)

(b)

(a)

(b)

(a)

(b)

SEMICONDUCTOR DEVICE, DISPLAY APPARATUS, AND METHOD OF MANUFACTURING SEMICONDUCTOR DEVICE

TECHNICAL FIELD

The present invention relates to a semiconductor device including a thin film transistor (TFT), a display apparatus, and a method of manufacturing the semiconductor device.

BACKGROUND ART

Display apparatuses which include active matrix substrates in which respective switching elements are installed for respective pixels are broadly used. The active matrix substrates including thin film transistors (hereinafter referred to as "TFTs") as the switching elements are referred to as TFT substrates. In the present specification, portions of the TFT substrates corresponding to pixels of the display apparatuses are referred to as pixels in some cases.

In recent years, oxide semiconductors are proposed to be used as materials of active layers of TFTs, instead of amorphous silicon or polycrystal silicon. The TFTs are referred to as "oxide semiconductor TFTs". The oxide semiconductors have mobility higher than the amorphous silicon. Therefore, the oxide semiconductor TFTs can operate at a higher speed than the amorphous silicon TFTs. Since oxide semiconductor films are formed in simpler processes than polycrystal silicon films, the oxide semiconductor films can also be applied to apparatuses which may have large areas.

A TFT substrate in which oxide semiconductor TFTs are used is disclosed in, for example, PTL 1. In the TFT substrate disclosed in PTL 1, an oxide semiconductor TFT (hereinafter simply abbreviated for a "TFT") held by a substrate and a pixel electrode electrically connected to a drain electrode of the TFT are included for each pixel. The TFT is normally covered with an inter-layer insulation layer. A pixel electrode is installed on the inter-layer insulation layer and is connected to a drain electrode of the TFT in a contact hole formed in the inter-layer insulation layer. Such a structure is disclosed in, for example, PTL 1. In the present specification, a connection portion between the drain electrode and the pixel electrode of the TFT is referred to as a "contact portion". A region opened by the contact hole, that is, a region which is the bottom surface of the contact hole, is referred to as an "opening region of the contact hole" in some cases.

In the contract portion disclosed in PTL 1, the drain electrode has a larger pattern than the bottom surface (opening region) of the contact hole installed in an inter-layer insulation layer in consideration of an alignment error or the like in a manufacturing process when viewed in the normal direction of a substrate. Thus, since the entire opening region of the contact hole is disposed to overlap the drain electrode, it is possible to ensure a contact area of the drain electrode and the pixel electrode. The entire contact portion can be shielded from light by the drain electrode.

CITATION LIST

Patent Literature

PTL 1: Japanese Unexamined Patent Application Publication No. 2013-105136

SUMMARY OF INVENTION

Technical Problem

For example, in the TFT substrate of the related art disclosed in PTL 1, the drain electrode is disposed to shield the entire opening region of the contact hole from light. Therefore, this may become a factor deteriorating in a ratio of a light transmission region occupied in a pixel (hereinafter referred to as a "pixel aperture ratio"). In particular, as the inter-layer insulation layer is thicker, the contact hole becomes deeper, and thus the opening region of the contact hole tends to increase. When the opening region of the contact hole increases, the area of a light-shielding region by the drain electrode also increases.

Accordingly, in a display apparatus including the TFT substrate of the related art, as the opening region of the contact hole further shields light, a region contributing to display in the pixel decreases. Therefore, there is a problem that light use efficiency deteriorates.

When high precision of a display apparatus progresses, the area of one pixel decreases. Therefore, light use efficiency considerably deteriorates since the light-shielding region is formed in the pixel.

An embodiment of the invention is devised in view of the foregoing circumstances and an object of the invention is to provide a semiconductor device capable of suppressing deterioration in light use efficiency and realizing higher precision, a display apparatus, and a method of manufacturing the semiconductor device.

Solution to Problem

According to an embodiment of the invention, there is provided a semiconductor device including: a substrate; a plurality of pixels that are arrayed in a matrix form in first and second directions on the substrate; a plurality of gate wirings that extend in the first direction; and a plurality of source wirings that extend in the second direction. Each of the plurality of pixels includes a thin film transistor that is held by the substrate and includes a gate electrode, a metal oxide layer, a gate insulation layer formed between the gate electrode and the metal oxide layer, and a source electrode and a drain electrode disposed to come into contact with the metal oxide layer, an inter-layer insulation layer that covers the thin film transistor, and a transparent conductive layer that is formed on the inter-layer insulation layer. The gate electrode is connected to one of the plurality of gate wirings and the source electrode is connected to one of the plurality of source wirings. The metal oxide layer includes a first portion overlapping the gate electrode via the gate insulation layer and a second portion not overlapping the gate electrode, the first portion includes a portion located between the source electrode and the drain electrode when viewed in a normal direction of the substrate, and the second portion crosses a different edge from an edge of the drain electrode in a side of the first portion when viewed in the normal direction of the substrate. The inter-layer insulation layer has a contact hole disposed to overlap a part of the drain electrode and at least a part of the second portion of the metal oxide layer when viewed in the normal direction of the substrate. The transparent conductive layer comes into contact with the drain electrode, the second portion of the metal oxide layer, and the gate insulation layer in the contact hole.

In a certain embodiment, a width of the second portion of the metal oxide layer in the first direction may be less than a width of the contact hole in the first direction.

In a certain embodiment, when viewed in the normal direction of the substrate, the thin film transistor and the contact hole may be arrayed in the second direction.

In a certain embodiment, when viewed in the normal direction of the substrate, the source electrode of the thin film transistor, the first portion of the metal oxide layer, and the drain electrode may be arrayed in this order in the second direction.

In a certain embodiment, a thickness of a portion of the gate insulation layer coming into contact with the transparent conductive layer may be less than thicknesses of other portions.

In a certain embodiment, a depth of a front surface of the gate insulation layer from an upper surface of the inter-layer insulation layer to a portion coming into contact with the transparent conductive layer may be equal to or less than 1 μm.

In a certain embodiment, the inter-layer insulation layer may not include an organic insulation layer.

In a certain embodiment, when viewed in the normal direction of the substrate, the metal oxide layer may extend to cross the contact hole in the second direction.

In a certain embodiment, when viewed in the normal direction of the substrate, a width of a portion overlapping the contact hole of the metal oxide layer in the second direction may be less than a width of the contact hole in the second direction.

In a certain embodiment, the first portion of the metal oxide layer may include a semiconductor region and the second portion includes a low resistant region which has resistance lower than the semiconductor region.

In a certain embodiment, the semiconductor device may further include another transparent conductive layer that is disposed onto transparent conductive layer via a dielectric layer. The transparent conductive layer functions as a pixel electrode. The other transparent conductive layer may function as a common electrode.

In a certain embodiment, the metal oxide layer may include an In—Ga—Zn—O-based oxide.

In a certain embodiment, the In—Ga—Zn—O-based oxide may include a crystalline portion.

According to another embodiment of the invention, there is provided a display apparatus including: the semiconductor device according to any of the embodiments; a counter substrate that is disposed to face the semiconductor device; a liquid crystal layer that is disposed between the counter substrate and the semiconductor device; and an alignment film that is disposed between the semiconductor device and the liquid crystal layer. The alignment film is an optical alignment film and a part of the optical alignment film is disposed in the contact hole.

According to still another embodiment of the invention, there is provided a method of manufacturing a semiconductor device. The method includes: (a) forming a gate electrode and a gate wiring on a substrate; (b) forming a gate insulation layer covering the gate electrode and the gate wiring; (c) forming an oxide semiconductor film on the gate insulation layer and obtaining a metal oxide layer partially overlapping the gate electrode via the gate insulation layer by patterning the oxide semiconductor film; (d) forming a source electrode and a drain electrode coming into contact with an upper surface of the metal oxide layer so that at least a pan of a portion of the metal oxide layer overlapping the gate electrode becomes a first portion located between the source electrode and the drain electrode and at least a pan of a portion of the metal oxide layer not overlapping with the gate electrode becomes a second portion extending from a different edge from an edge of the drain electrode in a side of the first portion when viewed in the normal direction of the substrate; (e) forming an inter-layer insulation layer that covers the metal oxide layer, the source electrode, and the drain electrode; (f) forming a contact hole exposing at least a part of the second portion of the metal oxide layer, a part of the drain electrode, and a part of the gate insulation layer in the inter-layer insulation layer; and (g) forming a transparent conductive layer on the inter-layer insulation layer and in the contact hole so that the transparent conductive layer comes into direct contact with the drain electrode, the second portion of the metal oxide layer, and the gate insulation layer in the contact hole.

In a certain embodiment, the oxide semiconductor film may include an In—Ga—Zn—O-based semiconductor.

In a certain embodiment, the In—Ga—Zn—O-based semiconductor may include a crystalline portion.

According to still another embodiment of the invention, there is provided a semiconductor device including: a substrate; a plurality of pixels that are arrayed in a matrix form in first and second directions on the substrate; a plurality of gate wirings that extend in the first direction; and a plurality of source wirings that extend in the second direction. Each of the plurality of pixels includes a thin film transistor that is held by the substrate and includes a gate electrode, a metal oxide layer, a gate insulation layer formed between the gate electrode and the metal oxide layer, and a source electrode and a drain electrode disposed to come into contact with the metal oxide layer, an inter-layer insulation layer that covers the thin film transistor, and a transparent conductive layer that is formed on the inter-layer insulation layer. The gate electrode is connected to one of the plurality of gate wirings and the source electrode is connected to one of the plurality of source wirings. The metal oxide layer includes a first portion overlapping the gate electrode via the gate insulation layer and a second portion not overlapping the gate electrode, and the first portion includes a portion located between the source electrode and the drain electrode when viewed in a normal direction of the substrate. The inter-layer insulation layer has a contact hole disposed to overlap a part of the drain electrode when viewed in the normal direction of the substrate. The transparent conductive layer comes into contact with the drain electrode and the gate insulation layer in the contact hole.

In a certain embodiment, when viewed in the normal direction of the substrate, the source electrode, the first portion of the metal oxide layer, the drain electrode, and the contact hole may be arrayed in this order in the second direction.

In a certain embodiment, when viewed in the normal direction of the substrate, both of a width of a portion of the drain electrode overlapping with the transparent conductive layer in the first direction and a width of the second portion of the metal oxide layer in the first direction may be less than a width of the contact hole in the first direction.

BRIEF DESCRIPTION OF DRAWINGS

FIG. 3(a) is a diagram illustrating a TFT vertical structure, and FIG. 3(b) is a diagram illustrating a TFT horizontal structure.

FIG. 4(a) is a diagram illustrating a TFT vertical structure, and FIG. 4(b) is a diagram illustrating a TFT horizontal structure.

FIG. 5 is a plan view exemplifying disposition of a drain electrode 18d and a metal oxide layer 16 in the contact hole 22a.

FIG. 6 is a schematic sectional view illustrating an inclination angle of a side surface of the contact hole 22a.

DESCRIPTION OF EMBODIMENTS

Figure 1:
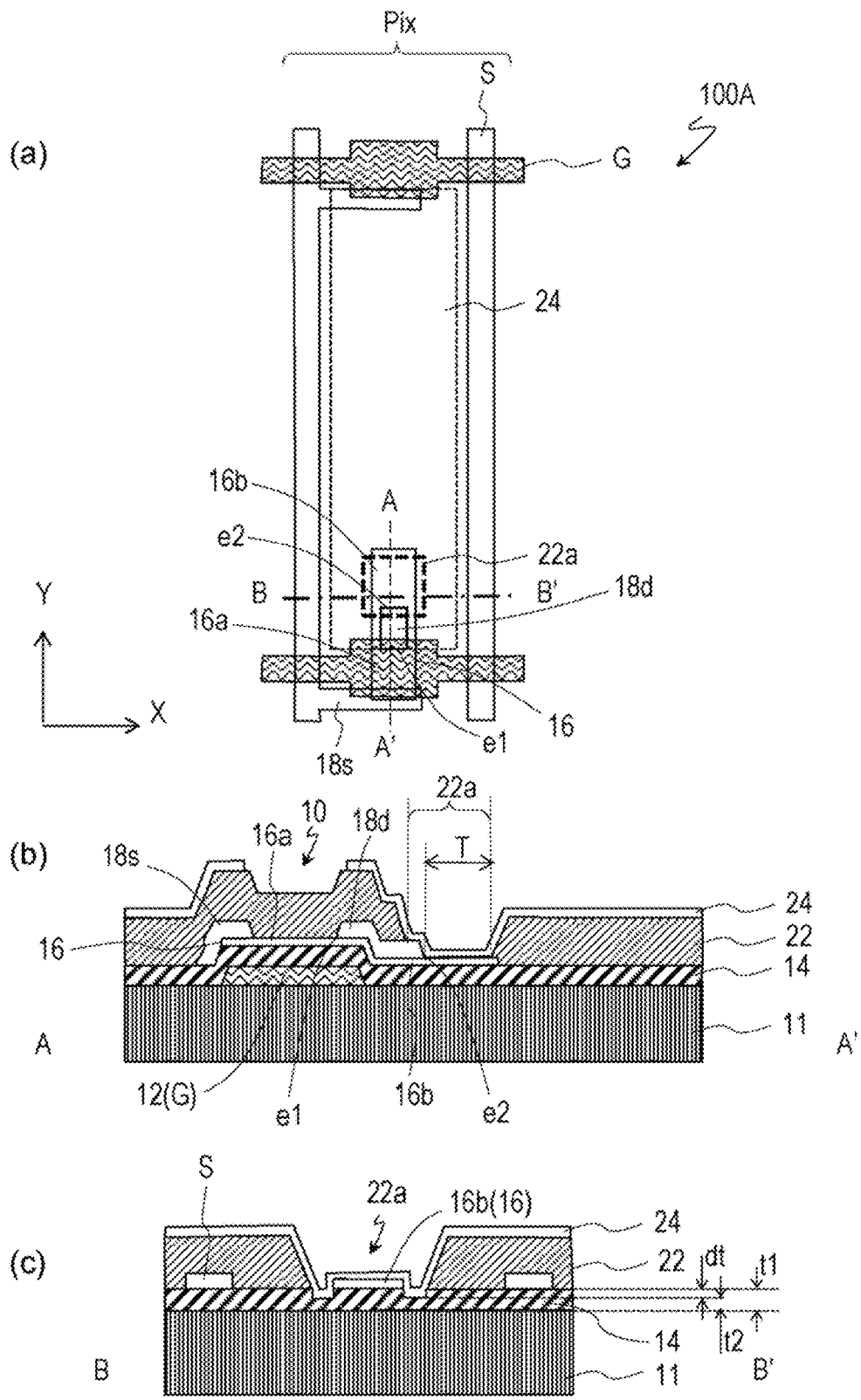
FIG. 1(*a*) is a schematic plan view illustrating a semiconductor device 100A according to a first embodiment and FIGS. 1(*b*) and 1(*c*) are sectional views taken along the lines A-A' and B-B' in the semiconductor device 100A.

In a TFT substrate of the related art, as described above, an entire opening region of a contact hole formed in an inter-layer insulation layer is shielded from light in a contact portion of a pixel electrode and a drain electrode. Therefore, there is a problem that a pixel aperture ratio deteriorates.

In contrast, in International Publication No. 2015/019857, the present applicant proposed a configuration in which a part of an opening region of a contact hole is configured as a light transmission region through which light (visible light) can be transmitted so the deterioration in the pixel aperture ratio can be suppressed. In this configuration, a metal oxide layer serving as an active layer of a TFT is installed to extend to an opening region of a contact hole. A pixel electrode is disposed to come into contact with both a drain electrode and extending metal oxide layers in a contact hole. Light can be transmitted through the metal oxide layers. Therefore, when viewed in the normal direction of a substrate, a part of the opening region of the contact hole can contribute to display as a light transmission region in which light is not shielded by the drain electrode.

Hereinafter, the configuration of a TFT substrate disclosed in International Publication No. 2015/019857 as a TFT substrate according to a reference example will be described specifically with reference to the drawings.

FIGS. 19(a) and 19(b) are a sectional view and a plan view exemplifying a TFT substrate 1000 according to a reference example.

The TFT substrate 1000 includes an oxide semiconductor TFT 10, an inter-layer insulation layer 22 covering the oxide semiconductor TFT 10, and a transparent conductive layer (pixel electrode) 24 on the substrate 11. The oxide semiconductor TFT 10 includes a gate electrode 12, a gate insulation layer 14 covering the gate electrode 12, a metal oxide layer 16 formed on the gate insulation layer 14, and a source electrode 18s and a drain electrode 18d connected to the metal oxide layer 16. The metal oxide layer 16 includes a first portion 16a serving as an active layer of the oxide semiconductor TFT 10 and a second portion 16b extending to cross an edge of the gate electrode 12. A contact hole 22a is formed in the inter-layer insulation layer 22. The contact hole 22a is disposed to overlap the second portion 16b of the metal oxide layer 16 and an end of the drain electrode 18d. The transparent conductive layer 24 is in contact with the end of the drain electrode 18d and the second portion 16b of the metal oxide layer 16 in the contact hole 22a.

Figure 19:
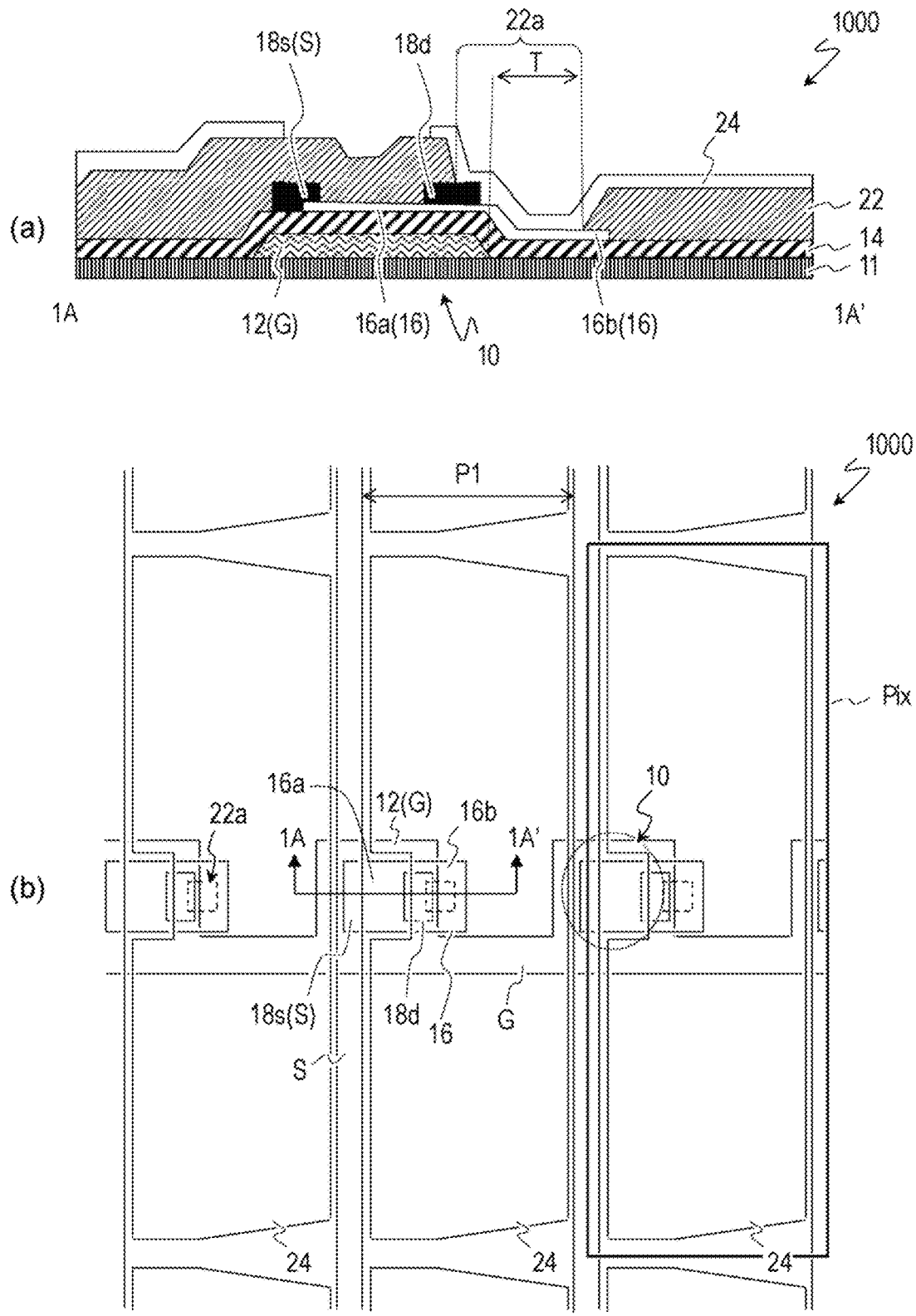
FIGS. 19(a) and 19(b) are a sectional view and a plan view exemplifying a TFT substrate 1000 according to a reference example.

In the reference example illustrated in FIG. 19, when viewed in the normal direction of the substrate 11, only a part of the opening region of the contact hole 22a serves as a light-shielding region in which light is shielded by the drain electrode 18d and the other parts can contribute to display as a light transmission region T. Priority is claimed on International Publication No. 2015/019857 the content of which is incorporated herein by reference.

The inventors have further examined and found that portions of the front surface of the metal oxide layer 16 coming into contact with conductors have low resistance and become low-resistant regions also referred to as "conductor regions"). In this example, a portion coming into contact with the drain electrode 18d and a portion coming into contact with the transparent conductive layer 24 in the front surface of the metal oxide layer 16 become low-resistant regions. Accordingly, the second portion 16b of the metal oxide layer 16 can function as a conductor layer electrically connected to the drain electrode 18d. Thus, an area in which the drain electrode 18d comes into direct contact with the transparent conductive layer 24 can be reduced without considerably increasing contact resistance. As a result, it is possible to reduce the area of a light-shielding region occupied in a pixel.

In the present specification, a layer formed above a gate insulation layer and located in an opening region of a contact hole is referred to as an "underlying layer" of the contact hole in some cases. The underlying layer may be a layer including a conductive layer or a conductor region. In the configuration disclosed in PTL 1, a drain electrode serves as an underlying layer of the contact hole. On the other hand, in the TFT substrate 1000 illustrated in FIG. 19, a drain electrode and the metal oxide layer 16 installed to extend from an oxide semiconductor TFT serve as underlying layers.

However, the present inventors have found that it is difficult to realize higher precision since the width of a pixel is restricted to the width of the underlying layer of the contact hole 22a in the TFT substrate 1000 according to the reference example. As illustrated in FIG. 19(*b*), an oxide semiconductor TFT 10 and a contact portion are disposed in each pixel. In the contact portion, the metal oxide layer 16 with a size larger than the contact hole 22a is installed to extend and serves as an underlying layer of the contact hole 22a in the illustrated example, a width P1 of a pixel in the row direction (which is a direction oriented along a gate wiring) is set to be sufficiently larger than a sum width of the oxide semiconductor TFT 10 and the underlying layer of the contact hole 22a.

Accordingly, the present inventors have thoroughly examined the structure of a contact portion in which higher precision can be realized. As a result, the present inventors have found that a pixel can be further fined while deterioration in the pixel aperture ratio is suppressed by reducing the width of the metal oxide layer serving as an underlying layer of a contact hole and have finalized the present invention.

(First Embodiment)

Hereinafter, a semiconductor device according to an embodiment of the invention will be described with reference to the drawings. Hereinafter, a TFT substrate used in a liquid crystal display apparatus will be exemplified as the semiconductor device. Examples of the semiconductor device according to an embodiment of the invention include TFT substrates of other transmissive display apparatuses, for example, an electrophoretic display apparatus, a micro electro mechanical system MEMS) display apparatus, and an organic electroluminescence (EL) display apparatus.

First, the structure of a semiconductor device (TFT substrate) 100A according to an embodiment of the invention will be described with reference to FIG. 1. In the following description, common reference numerals are given to constituent elements having substantially the same functions and the description thereof will be omitted.

FIG. 1 is a diagram schematically illustrating the structure of the semiconductor device 100A according to a first embodiment of the invention. FIG. 1(*a*) is a schematic plane view and FIGS. 1(*b*) and 1(*c*) are sectional views taken along the lines A-A' and B-B' illustrated in FIG. 1(*a*).

The semiconductor device 100A includes a substrate 11, a plurality of pixels Pix, source wirings S extending in the column direction, and gate wirings G extending the row direction on the substrate 11. The pixels Pix are arrayed in a matrix form in an X direction (also referred to as a "row direction" or a "first direction") and a Y direction also referred to as a "column direction" or a "second direction") different form the X direction and correspond to pixels of a liquid crystal display apparatus. The row direction and the column direction may be perpendicular to each other. In the semiconductor device 100A, a region including the plurality of pixels Pix is referred to as a "display region" and a region other than the display region is referred to as a "non-display region" or a "frame region". A terminal portion, a driving circuit, and the like can be installed in the non-display region.

Each pixel Pix includes an oxide semiconductor TFT 10 held by the substrate 11, an inter-layer insulation layer 22 covering the oxide semiconductor TFT 10, and a transparent conductive layer (for example, a pixel electrode) 24. The transparent conductive layer 24 is electrically connected to the oxide semiconductor TFT 10.

The oxide semiconductor TFT 10 is, for example, a bottom gate, type TFT that has a top contact structure. The oxide semiconductor TFT 10 includes a gate electrode 12, a gate insulation layer 14 covering the gate electrode 12, a metal oxide layer 16 formed on the gate insulation layer 14, a source electrode 18s, and a drain electrode 18d. The metal oxide layer 16 includes a channel region. The gate electrode 12 is connected to a corresponding gate wiring G and the source electrode 18s is connected to a corresponding source wiring S. A illustrated, the gate electrode 12 and the gate wiring G may be integrated and the source electrode 18s and the source wiring S may be integrated. The source electrode 18s and the drain electrode 18d are disposed to come into contact with the upper surface of the metal oxide layer 16 via a channel region.

The metal oxide laser 16 includes a first portion 16a that overlaps the gate electrode 12 via the gate insulation layer 14 and a second portion 16b that does not overlap the gate electrode 12 via the gate insulation layer 14. The first portion 16a includes a portion (channel region) located between the source electrode 18s and the drain electrode 18d when viewed in the normal direction of the substrate 11. On the other hand, the second portion 16b is disposed to cross an edge e2 different from an edge e1 of the drain electrode 18d on the side of the first portion 16a when viewed in the normal direction of the substrate 11. In this example, the second portion 16b crosses the edge e2 of the drain electrode 18d and extends in a direction away from the first portion 16a (channel region).

A "metal oxide layer" mentioned in the present specification is a layer including a semiconductor region that functions as an active layer of the oxide semiconductor TFT. As described above, the metal oxide layer includes a region (conductor region) that partially has low resistance in some cases. For example, in a case in which the metal oxide layer comes into contact with a conductor layer such as a metal layer, a portion coming into contact with the conductor layer in the front surface of the metal oxide layer can have low resistance. The metal oxide layer may be formed from the same oxide semiconductor film. In a process of manufacturing the semiconductor device, a part of the metal oxide layer has low resistance and becomes a conductor region and the other part may remain as a semiconductor region. Only the front surface of the metal oxide layer has low resistance in some cases or a portion in the thickness direction of the metal oxide layer has low resistance in some cases.

The metal oxide layer 16 may extend to cross the edge one end of the gate electrode 12 from the first portion 16a. In this case, a portion extending from the edge of the gate electrode 12 serves as the second portion 16b. In this example, the metal oxide layer 16 has an island-shaped pattern including the first portion 16a and the second portion 16b, but the first portion 16a and the second portion 16b may be separated from each other.

The source electrode 18s and the drain electrode 18d are disposed to be separated and face each other on the first portion 16a of the metal oxide layer 16 and come into contact with the upper surface of the first portion 16a. The drain electrode 18d is disposed to also come into contact with the upper surface of the second portion 16b. As illustrated, when viewed in the normal direction of the substrate 11, the source wiring S may include a portion extending in the column direction and an extension portion extending in the row direction in the portion extending in the column direction. The extension portion is also disposed on the upper surface of the metal oxide layer 16 and serves as the source electrode 18s. The drain electrode 18d may extend to cross the edge of the gate electrode 12 from the first portion 16a and may come into contact with the upper surface of the second portion 16b of the metal oxide layer 16. The width of the drain electrode 18d in a channel width direction may be less than the width of the metal oxide layer 16 in the channel width direction.

The source wiring S, the source electrode 18s, and the drain electrode 18d may be formed of the same metal film a source wiring layer). The gate wiring G and the gate electrode 12 may be formed of the same metal film (a gate wiring layer). These wiring layers include a layer formed of metal and have a light-shielding property. In general, a layer formed of metal has higher conductivity than a transparent conductive layer. Therefore, the width of the wiring can be narrowed, which can contribute to high precision and an improvement in the pixel aperture ratio.

A contact hole 22a is formed in the inter-layer insulation layer 22. The contact hole 22a is disposed to overlap a pan of the drain electrode 18d and at least a part of the second portion 16b of the metal oxide layer 16. The disposition and a planar shape of the contact hole 22a described in the present specification are assumed to indicate disposition and a planar shape of an opening region of the contact hole 22a (the bottom surface of the contact hole 22a ). The planar shape of the contact hole 22a illustrated in FIG. 1 and the following drawings is the shape of a bottom surface of the contact hole 22a in a case in which the shape of the opening region of the contact hole 22a, for example, the side surface of the contact hole 22a, is inclined.

In the embodiment, the contact hole 22a is formed so that not only the drain electrode 18d and the metal oxide layer 16 but also the gate insulation layer 14 are exposed. In the illustrated example, the contact hole 22a is disposed to overlap the edge e2 of the drain electrode 18d and overlap with a part of the edge of the second portion 16b of the metal oxide layer 16 when viewed in the normal direction of the substrate 11. The width of a portion overlapping the contact hole 22a in the row direction in the second portion 16b of the metal oxide layer 16 may be less than the width of the contact hole 22a in the row direction. The width of the contact hole 22a is set to be, for example, 2 μm or more due to restrictions on processes (process rules).

The transparent conductive layer 24 is installed on the inter-layer insulation layer 22 and in the contact hole 22a. The transparent conductive layer 24 comes into direct contact with the drain electrode 18d, the second portion 16b of the metal oxide layer 16, and the gate insulation layer 14 in the contact hole 22a. In this example, the transparent conductive layer 24 comes into direct contact with an upper surface near the edge e2 of the drain electrode 18d and the side surface of the drain electrode 18d in the contact hole 22a. Thus, the transparent conductive layer 24 can be electrically connected to the drain electrode 18d.

A portion coming into contact with a conductor (the drain electrode 18d or the transparent conductive layer 24) of the front surface of the metal oxide layer 16 becomes a low-resistant region (or a conductor region) which has lower electric resistance than the first portion 16a. The low-resistant region of the metal oxide layer 16 can function as a connection layer that connects the drain electrode 18d to the transparent conductive layer 24. Accordingly, even when an area in which the transparent conductive layer 24 comes into direct contact with the drain electrode 18d is small, it is possible to suppress an increase in the contact resistance. Accordingly, it is possible to further suppress the deterioration in the aperture ratio by the drain electrode 18d while suppressing the contact resistance.

In the embodiment, since the area of the metal oxide layer 16 which underlies the contact hole 22a is reduced, the size of the pixel Pix can be reduced. In a semiconductor device of the related art and the semiconductor device 1000 according to the reference example illustrated in FIG. 19, the underlying layer (the drain electrode or the metal oxide layer) of the contact hole has a larger size than the contact hole when viewed in the normal direction of the substrate. To form a fine pixel, it is desirable to reduce the size of the contact hole as much as possible, but there are restrictions on processes. In the semiconductor device 100A according to the embodiment, however, for example, the width of the metal oxide layer 16 which underlies the contact hole 22a in the row direction can be set to be less than the width of the contact hole in the row direction. Therefore, it is possible to further reduce the width of the pixel Pix.

In the oxide semiconductor TFT 10, the gate insulation layer 14 may be disposed between the gate electrode 12 and the metal oxide layer 16. The oxide semiconductor TFT 10 is not limited to the bottom gate type TFT, but may be a top gate type TFT in which the gate electrode 12 is disposed on an opposite side to the substrate 11 of the metal oxide layer 16.

The metal oxide layer 16 may extend to cross the contact hole 22a in the column direction when viewed in the normal direction of the substrate 11. Thus, it is possible to further decrease the width of the metal oxide layer 16 in the row direction while ensuring a contact area of the transparent conductive layer 24 and the drain electrode 18d or the metal oxide layer 16. Accordingly, it is possible to reduce a pixel pitch P1 more effectively.

The disposition of the oxide semiconductor TFT 10 and the contact hole 22a when viewed in the normal direction of the substrate 11 is not particularly limited. However, to further decrease the drain electrode 18d, it is desirable to dispose the contact hole 22a to overlap the edge e2 of the drain electrode 18d on the opposite side to the channel region. In the illustrated example, when viewed in the normal direction of the substrate 11, the oxide semiconductor TFT 10 and the contact hole 22a are arrayed in the column direction, but may be arrayed in the row direction. Hereinafter, more specific description will be made with reference to the drawings.

<Disposition Relation Between Oxide Semiconductor TFT 10 and Contact Hole 22a>

FIGS. 2(a) and 2(b) are enlarged plan views exemplifying a disposition relation between the oxide semiconductor TFT and the contact hole 22a in the pixel Pix.

In the example illustrated in FIG. 2(a), the source electrode 18s, the channel region, and the drain electrode 18d of the oxide semiconductor TFT 10 are disposed in this order in the column direction. The disposition of the TFT is referred to as a "TFT vertical structure". The contact hole 22a is disposed to overlap the edge e2 opposite to the channel region in the drain electrode 18d. Accordingly, the contact hole 22a and the oxide semiconductor TFT 10 are arrayed in the column direction. The shape of the second portion 16b of the metal oxide layer 16 is not particularly limited. For example, a width w1 of a portion overlapping the contact hole 22a in the row direction in the second portion 16b may be less than a width z1 of the contact hole 22a in the row direction.

In the example illustrated in FIG. 2(b), the source electrode 18s, the channel region, and the drain electrode 18d of the oxide semiconductor TFT 10 are disposed in this order in the row direction. The disposition of the TFT is referral to as a "TFT horizontal structure". The contact hole 22a is disposed to overlap the edge e2 opposite to the channel region in the drain electrode 18d. Accordingly, the contact hole 22a and the oxide semiconductor TFT 10 are arrayed in the row direction. The shape of the second portion 16b of the metal oxide layer 16 is not particularly limited. For example, the width w1 of the portion overlapping the contact hole 22a in the row direction in the second portion 16b may be less than the width z1 of the contact hole 22a in the row direction.

Figure 2:
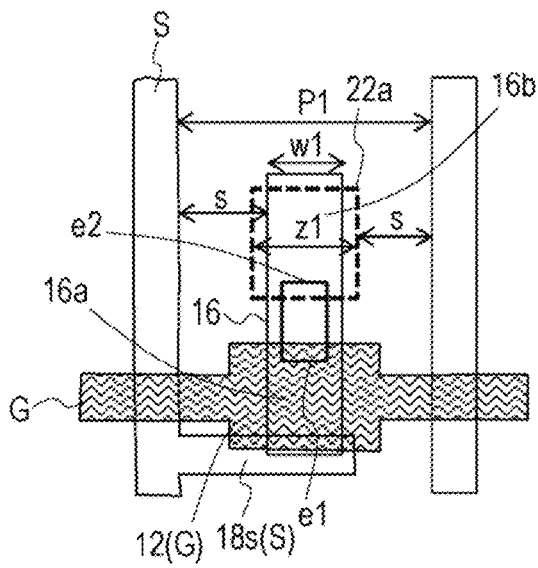
FIGS. 2(*a*) and 2(*b*) are enlarged plan views exemplifying a disposition relation between an oxide semiconductor TFT 10 and a contact hole 22*a* in a pixel Pix, FIG. 2(*a*) is a diagram illustrating a TFT vertical structure, and FIG. 2(*b*) is a diagram illustrating a TFT horizontal structure.
Figure 2:
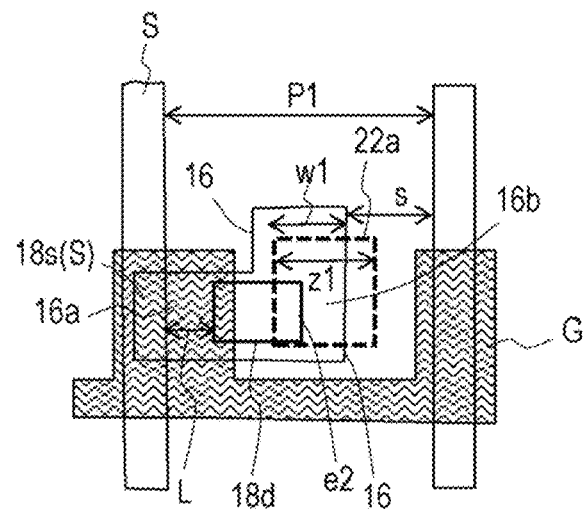
Figure 3:
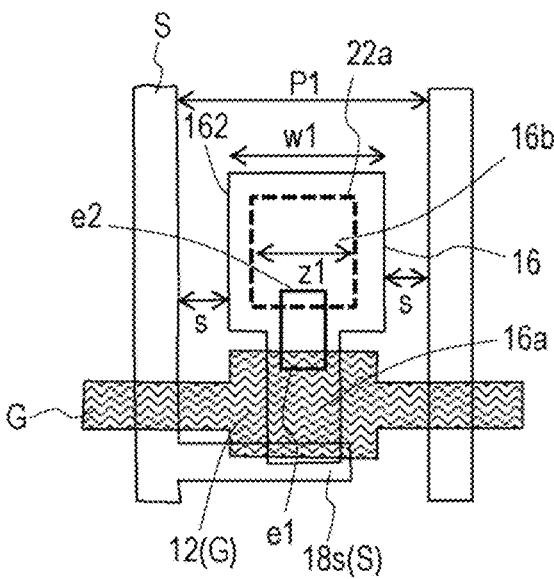
FIGS. 3(a) and 3(b) are enlarged plan views exemplifying a disposition relation between an oxide, semiconductor TFT 10 and a contact hole 22a according to Comparative Examples 1 and 2.
Figure 3:
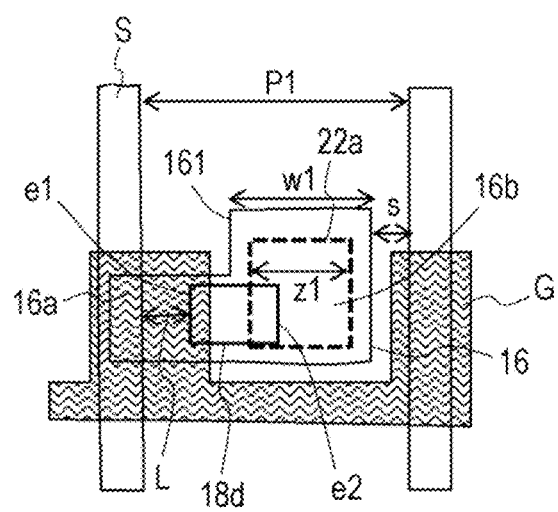

To make comparison, FIGS. 3(a) and 3(b) are enlarged plan views illustrating parts of pixels in the semiconductor devices according to Comparative Examples 1 and 2. In FIG. 3, the same reference numerals are given to the same constituent elements s those of FIG. 2.

In the semiconductor device according to Comparative Example 1 illustrated in FIG. 3(a), the oxide semiconductor TFT 10 and the contact hole 22a are arrayed in the column direction as in the example illustrated in FIG. 2(a). In the semiconductor device according to Comparative Example 2 illustrated in FIG. 3(a), the oxide semiconductor TFT 10 and the contact hole 22a are arrayed in the row direction as in the example illustrated in FIG. 2(b). In the comparative examples, the width w1 of the metal oxide layer 16 which underlies the contact hole 22a in the row direction is greater than the width z1 of the contact hole 22a in the row direction. The entire contact hole 22a is disposed to overlap the metal oxide layer 16.

As understood from FIGS. 2(a) and 3(a), in a case in which the oxide semiconductor TFT 10 and the contact hole 22a are disposed in the column direction, the pixel pitch P1 in the row direction is set to be equal to or greater than a length obtained by adding the width w1 of the layer (the second portion 16b of the metal oxide layer 16) which underlies the contact hole 22a in the row direction and a space s for suppressing short-circuiting between the second portion 16b and the source wirings S on both sides of the second portion 16b (P1≥w1+s×2). When the high precision of the semiconductor device 100A progresses, the pixel pitch P1 is substantially limited with the width w1 and the space s. In the example illustrated in FIG. 2(a), the width w1 of the metal oxide layer 16 can be set to be less than that of Comparative Example 1 illustrated in FIG. 3(a). Therefore, it is possible to further reduce the pixel pitch P1.

On the other hand, as understood from FIGS. 2(b) and 3(b), in a case in which the oxide semiconductor TFT 10 and the contact hole 22a are disposed in the row direction, the pixel pitch P1 in the row direction is set to be equal to or greater than a length obtained by adding the width w1 of the layer (the metal oxide layer 16) which underlies the contact hole 22a in the row direction, the space s for suppressing short-circuiting between the second portion 16b and the source wirings S, and a channel region (channel length) of the oxide semiconductor TFT 10. In the example illustrated in FIG. 2(b), the width w1 of the metal oxide layer 16 can be set to be less than that of Comparative Example 2 illustrated in FIG. 3(b). Therefore, it is possible to further reduce the pixel pitch P1.

In comparison between the structures in FIGS. 2(a) and 2(b), the fine pixel can be achieved more efficiently in a case in which the oxide semiconductor TFT 10 and the contact hole 22a are disposed in the column direction FIG. 2(a)) than in a case in which the oxide semiconductor TFT 10 and the contact hole 22a are disposed in the row direction (FIG. 2(b) since the pixel pitch P1 is not restricted to the width of the channel region and is restricted only to the size of the underlying layer of the contact hole 22a.

The fact that "the oxide semiconductor TFT 10 and the contact hole 22a are disposed in the column direction" means that, as illustrated in FIG. 4(a), the oxide semiconductor TFT 10 and the contact hole 22a may be disposed so that the channel region is located between a straight line i extending in the column direction through a point which is the closest to one adjacent source wiring S in the contact hole 22a, when viewed in the normal direction of the substrate 11, and a straight line ii extending in the column direction through a point which is the closest to the other adjacent source wiring S. In this case, the pixel pitch P1 is not restricted to the size of the channel region and is restricted only to the size of the contact hole 22a. On the other hand the fact that "the oxide semiconductor TFT 10 and the contact hole 22a are disposed in the row direction" includes a case in which at least a part of the channel region protrudes from an interval between the straight lines i and ii when viewed in the normal direction of the substrate 11, as illustrated in FIG. 4(b). In this case, the pixel pitch P1 is restricted not only to the size of the contact hole 22a but also to the size of the channel region.

Figure 4:
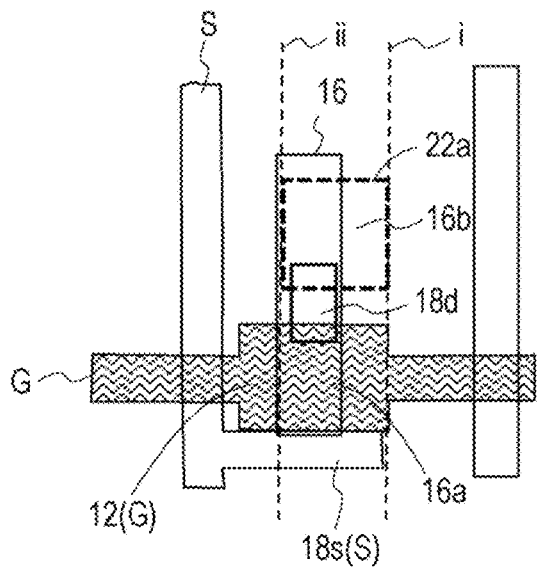
FIGS. 4(a) and 4(b) are enlarged plan views exemplifying another disposition relation between an oxide semiconductor TFT 10 and a contact hole 22a in a pixel Pix.
Figure 4:
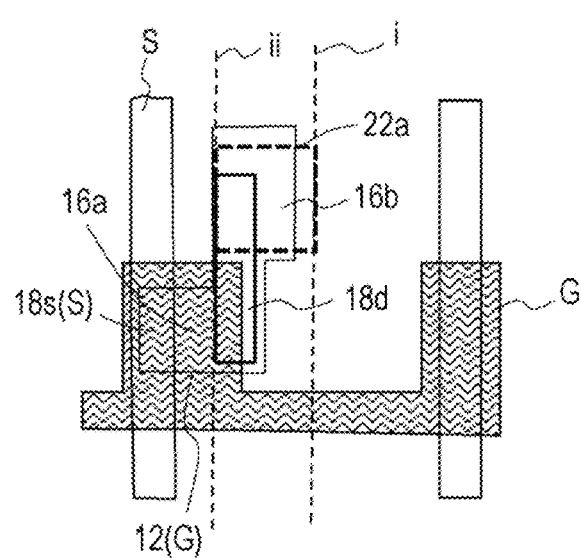

A disposition relation between the metal oxide layer 16 and the contact hole 22a is not limited to the examples exemplified in FIGS. 2 and 4. As will be described below, when viewed in the normal direction of the substrate 11, the width of a portion overlapping the contact hole 22a in the column direction in the second portion 16b of the metal oxide layer 16 may be less than the width of the contact hole 22a in the column direction.

In the illustrated example, the metal oxide layer 16 has one island-shaped pattern including the first portion 16a and the second portion 16b, but may have a plurality of island-shaped patterns separated from each other. For example, although not illustrated, the metal oxide layer 16 may have a first pattern including the first portion 16a which can function as a channel region and a second pattern including the second portion 16b which can function as a connection layer between the drain electrode 18d and the transparent conductive layer 24. The second pattern may be disposed to come into contact with both of the drain electrode 18d and the transparent conductive layer 24.

Next, referring back to FIG. 1(c), overetching of the gate insulation layer 14 will be described.

As illustrated in FIG. 1(c), a thickness t2 of a portion coming into contact with the transparent conductive layer 24 in the gate insulation layer 14 may be less than a thickness t1 of the other portions. For example, this structure can be obtained by removing (overetching) up to the front surface of the gate insulation layer 14 under etching conditions when the contact hole 22a is formed in the inter-layer insulation layer 22. In the present specification, a difference dt (=t1−t2) in the thickness of the gate insulation layer 14 is referred to as an overetching amount.

To reduce a step difference of the contact hole 22a, it is desirable to reduce the overetching amount dt of the gate insulation layer 14. The overetching amount dt can be controlled in accordance with a material of the gate insulation layer 14 and etching conditions. The overetching amount dt is not particularly limited and may be, for example, 0.4 µm or less. When the gate insulation layer 14 includes a different material from the material of the inter-layer insulation layer 22, the overetching amount can be suppressed using a difference in an etching rate. As an example, hen the inter-layer insulation layer 22 is an oxide film such as a silicon oxide film, the gate insulation layer 14 preferably includes a nitride film. As will be described, when the gate insulation layer 14 has a laminate structure in which a nitride film is a lower layer and an oxide film is an upper layer, the overetching amount can be suppressed to the thickness or less of the upper layer by etching the inter-layer insulation layer 22 under the condition that an etching rate of the lower layer of the gate insulation layer 14 decreases.

In the semiconductor device 100A, a step difference by the contact hole 22a is preferably, for example, 1 µm or less. As described above, in the semiconductor device 100A, a part of the opening region of the contact hole 22a serves as the light transmission region T in which neither the gate electrode 12 nor the drain electrode 18d is shielded from light, which can contribute to display. When the step difference of the contact hole 22a is set to be small, disarray of liquid crystal alignment resulting from the contact hole 22a can be set to be small. Therefore, it is possible to suppress light leakage occurring near the contact hale 22a. Therefore, even when the entire opening region of the contact hole 22a is shielded from light by the drain electrode 18d, the gate electrode 12, or the it is possible to realize high display characteristics.

The inter-layer insulation layer 22 may formed of an inorganic insulation material and may not include an organic insulation layer. Alternatively, the inter-layer insulation layer 22 may not include a flattened layer formed of an organic or inorganic insulation material. Thus, since the thickness of the inter-layer insulation layer 22 can be set to be small, the relatively thin contact hole 22a is formed. Accordingly, it is possible to reduce light leakage near the contact hole 22a.

In the embodiment, the step difference (maximum step difference) by the contact hole 22a refers to a depth from the upper surface of the inter-layer insulation layer 22 to a portion coming into contact into contact with the transparent conductive layer 24 in the front surface of the gate insulation layer 14. The step difference of the contact hole 22a is, for example, a sum thickness of the inter-layer insulation layer 22, the drain electrode 18d, and the metal oxide layer 16. In a case in which the gate insulation layer 14 is overetched, a value is obtained by adding the overetching amount dt (=t1−t2) of the gate insulation layer 14 to the sum thickness. To suppress the step difference of the contact hole 22a, for example, it is desirable to set the thickness of the inter-layer insulation layer 22 to be small (for example, 1 µm or less). When the inter-layer insulation layer 22 is set to be thin, the depth of the contact hole 22a can be set to be small and the width of an inclination portion of the contact hole can be reduced. Therefore, it is possible to suppress the light leakage more efficiently.

In the semiconductor device 1000 according to the reference example, the metal oxide layer 16 that underlies the contact hole 22a is set to have a size greater than the bottom surface of the contact hole 22a. Therefore, the gate insulation layer 14 is not overetched at the time of forming the contact hole. In the embodiment, however, the step difference of the contact hole 22a is larger in proportion to the overetching amount compared to the semiconductor device 1000. A step difference structure which has more step differences is formed by the overetching. However, for example, by using an alignment film (optical alignment film) subjected to an optical alignment process as an alignment film provided on the liquid crystal layer side of the semiconductor device 100A, it is possible to control liquid crystal alignment of a portion located in a contact portion in the liquid crystal layer with high precision even in a case in which the number of step differences increases or the step differences increase. Accordingly, it is possible to suppress light leakage resulting from the overetching of the gate insulation layer 14. As described above, the overetching amount dt of the gate insulation layer 14 may be controlled by controlling the etching conditions or the like. Thus, it is possible to suppress the step difference of the contact hole 22a within a predetermined range.

Figure 5:
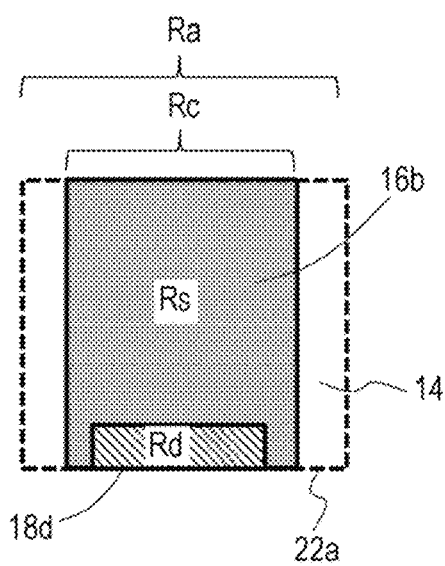

Next, a ratio of the contact region to the light-shielding region occupied in the opening region of the contact hole 22a will be described with reference to FIG. 5. FIG. 5 is a plan view exemplifying disposition of the drain electrode 18d and the metal oxide layer 16 in the contact hole 22a.

In the embodiment, the transparent conductive layer 24 comes into direct contact with the drain electrode 18d or the second portion 16b of the metal oxide layer 16 in the contact hole 22a. A region Rc in which the transparent conductive layer 24 comes into contact the drain electrode 18d or the second portion 16b of the metal oxide layer 16 is referred to as a "contact region". When viewed in the normal direction of the substrate 11, a ratio of the area of the contact region Rc occupying the entire opening region Ra of the contact hole 22a is, for example, equal to or greater than 50% and less than 100%. Thus, it is possible to suppress the contact resistance to be lower. The ratio of the area of the contact region Rc occupying the entire opening region Ra may be less than 90%. In this case, since the width of the contact region Rc in the row direction can be decreased, it is possible to reduce the pixel pitch P1 more efficiently.

When viewed in the normal direction of the substrate 11, a ratio at which the area of a portion ("light-shielding region") Rd located in the opening region Ra of the contact hole 22a in the drain electrode 18d occupies the entire opening region Ra of the contact hole 22a may be, for example, greater than 0% and less than 50% and may be preferably equal to or less than 30%. By setting the area of the portion Rd of the drain electrode 18d to be small, it is possible to reduce the ratio of the area of the light-shielding region occupied in the opening region Ra of the contact hole 22a.

A ratio at which the area of a portion Rs located in the opening region Ra of the contact hole 22a in the metal oxide layer 16 occupies the entire opening region Ra of the contact hole 22a may be, for example, equal to or greater than 50% and less than 100% and may be preferably 70% or more. When the ratio of the area of the portion Rs of the metal oxide layer 16 is equal to or greater than 50%, the light transmission region T can be set to be greater while suppressing an increase in the contact resistance. Accordingly, it is possible to improve the pixel aperture ratio more efficiently.

The portion Rs located in the opening region Ra of the contact hole 22a in the metal oxide layer 16 is preferably greater than the portion (the light-shielding region) Rd located in the opening region Ra of the contact hole 22a in the drain electrode 18d. Thus, since the ratio of the light-shielding region disposed in the contact portion can be decreased, it is possible to suppress the deterioration in the light use efficiency resulting from the light-shielding region of the contact portion more efficiently.

Further, when viewed in the normal direction of the substrate 11, a side wall (circumference) of the contact hole 22a may be disposed to cross the drain electrode 18d. Thus, the transparent conductive layer 24 can be in contact with not only the upper surface of the drain electrode 18d but also the side surface in the contact hole 22a. Therefore, it is possible to ensure a contact area between the drain electrode 18d and the transparent conductive layer 24 while suppressing the light-shielding region by the drain electrode 18d to be small.

Figure 6:
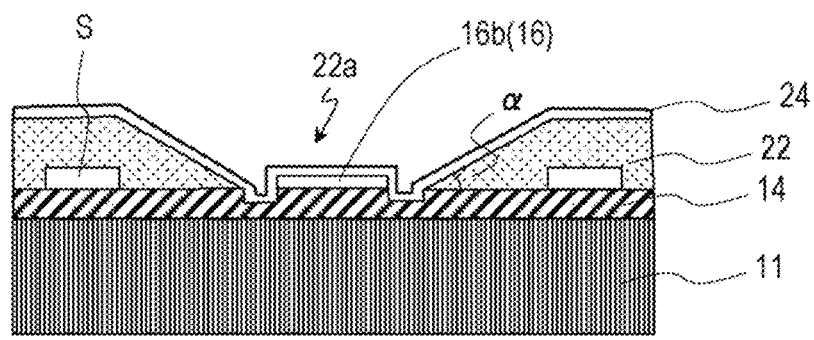

Next, an inclination angle of a side surface of the contact hole 22a will he described with reference to FIG. 6. FIG. 6 is a diagram exemplifying a cross-sectional structure of the contact portion vertical to the substrate 11.

As illustrated, an angle formed between the end surface of the inter-layer insulation layer 22 which is a side surface of the contact hole 22a and the front surface of the substrate 11 is assumed to be an inclination angle $\alpha$ of the side surface of the contact hole 22a.

In a semiconductor device of the related art, the inclination angle $\alpha$ of the side surface of the contact hole is set to be less than 90°, for example, about 40° to 60°. In a configuration in which the contact hole is shielded from light by the drain electrode or the like, the entire contact hole (including not only the bottom surface but also the side surface of the contact hole) is normally shielded from light in order to suppress light leakage occurring on the side surface of the contact hole. As the inclination angle $\alpha$ of the side surface of the contact hole is larger (closer to 90°), an area for shielding the contact hole from light can be reduced. Therefore, it is possible to improve the pixel aperture ratio. Therefore, in the related art, the contact hole is formed so that the inclination angle $\alpha$ is large to some extent (for example, 45° or more).

In the embodiment, however, since the entire contact hole 22a is not shielded from light, the inclination angle $\alpha$ may not be set to be large in consideration of the light-shielding region. The inclination angle $\alpha$ is not particularly limited and may be less than 40° and equal to or less than 30°, for example. When the inclination angle $\alpha$ is set to be equal to or less than 30° and the inclination angle of the side surface of the contact hole 22a is set to be small, liquid crystal alignment can be controlled with higher precision on the side surface of the contact hole 22a by the alignment film (optical alignment film). Therefore, it is possible to suppress the light leakage more efficiently. When the inclination angle $\alpha$ is set to be equal to or less than 15°, a further considerable advantageous effect can be obtained.

The inclination angle $\alpha$ of the side surface of the contact hole 22a can be controlled according to the etching conditions and the material of the inter-layer insulation layer 22. A specific example of a method of controlling the inclination angle $\alpha$ will be described later.

Although not illustrated, an alignment film (not illustrated) may be formed on the transparent conductive layer 24 (an opposite side to the substrate 11). The semiconductor device 100A is used in, for example, a liquid crystal display apparatus of a vertical electric field mode such twisted nematic (TN) mode or a vertical alignment (VA) mode.

The TFT substrate 100A can be modified in various forms. For example, another transparent conductive layer that functions as an auxiliary capacitance electrode may be installed on the transparent conductive layer (pixel electrode) 24 via a dielectric layer. Alternatively, another transparent conductive layer that functions as a common electrode may be installed on a side of the substrate 11 of the transparent conductive layer (pixel electrode) 24 or the liquid crystal layer side and may be applied to a liquid crystal display apparatus of a fringe field switching (FFS) mode.

The transparent conductive layer 24 may not be a pixel electrode. For example, a pixel electrode may be installed in an upper layer (liquid crystal layer side) of the transparent conductive layer 24, and the transparent conductive layer 24 may function as a connection portion connecting the pixel electrode to the drain electrode 18d of the TFT 10. In this case, a common electrode electrically separated from the transparent conductive layer 24 (connection portion) may be formed using the same transparent conductive film as the transparent conductive layer 24.

Further, in the embodiment, the channel-etch type TFT 10 is used. However, an etch-stop type TFT in which an etch-stop layer is included on a channel region may be included.

Hereinafter, a modification example of the semiconductor device according to the embodiment will be described with reference to the drawings.

Figure 7:
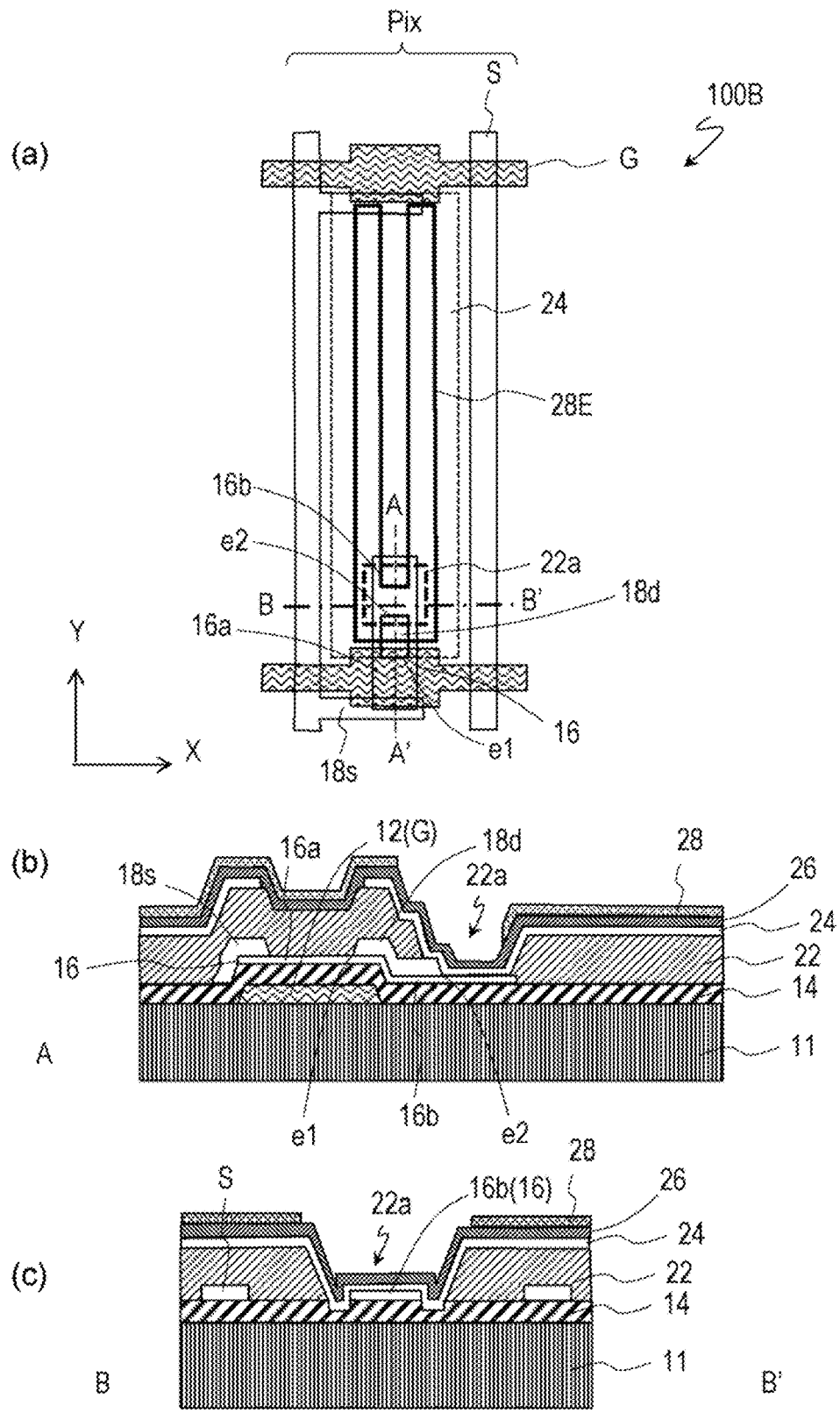
FIG. 7(a) is a schematic plan view illustrating another semiconductor device 100B according to the first embodiment and FIGS. 7(b) and 7(c) are sectional views taken along the lines A-A' and B-B' in the semiconductor device 100B.

FIG. 7 is a diagram schematically illustrating the structure of a semiconductor device 100B. FIG. 7(a) is a schematic plan view and FIGS. 7(b) and 7(c) are schematic sectional views taken along the lines A-A' and B-B' illustrated in FIG. 7(a), respectively. In FIG. 7, the same reference numerals are given to the same constituent elements as those in FIG. 1 and the description thereof will be omitted.

The semiconductor device 100B may be the same as the TFT substrate 100A illustrated in FIG. 1 except that another transparent conductive layer (hereinafter also referred to as an "upper transparent conductive layer") 28 is further included on a transparent conductive layer (hereinafter also referred to as a "lower transparent conductive layer") 24 via an insulation layer 26.

The lower transparent conductive layer 24 corresponds to the transparent conductive layer 24 of the TFT substrate 100A (FIG. 1) and functions as, for example, a pixel electrode. The insulation layer 26 is formed to cover the lower transparent conductive fryer 24. The upper transparent conductive layer 28 includes, for example, at least one slit 28E or a notch portion and functions as a common electrode in the pixel. An alignment film (not illustrated) may be formed on the upper transparent conductive layer 28. The semiconductor device 100B can be applied to, for example, a liquid crystal display apparatus of an FSS mode.

In the semiconductor device 100B, at least a part of the upper transparent conductive layer 28 is disposed to overlap (face) the lower transparent conductive layer 24 via the insulation layer 26. Thus, an auxiliary capacitance is formed in a portion in which the upper transparent conductive layer 28 overlaps the lower transparent conductive layer 24. In this way, in a case in which the auxiliary capacitance is formed by a two-layered electrode structure in which two transparent conductive layers are formed with the insulation layer 26 interposed therebetween, for example, an auxiliary capacitance electrode in which the same metal film as a source wiring is used may not be installed in the pixel, and thus a light-shielding region can be further reduced. Accordingly, it is possible to suppress the deterioration in the light use efficiency by providing the auxiliary capacitance in a pixel.

<Method of Manufacturing Semiconductor Device>

Next, an example of a method of manufacturing a semiconductor device according to the embodiment will be described as an example of a method of manufacturing the semiconductor device 100B. The semiconductor device 100A illustrated in FIGS. 1(a) and 1(b) can be manufactured according to the same method as the semiconductor device 100B except that the insulation layer 26 and the upper transparent conductive layer 28 are not formed, and thus the description thereof will be omitted.

Figure 8:
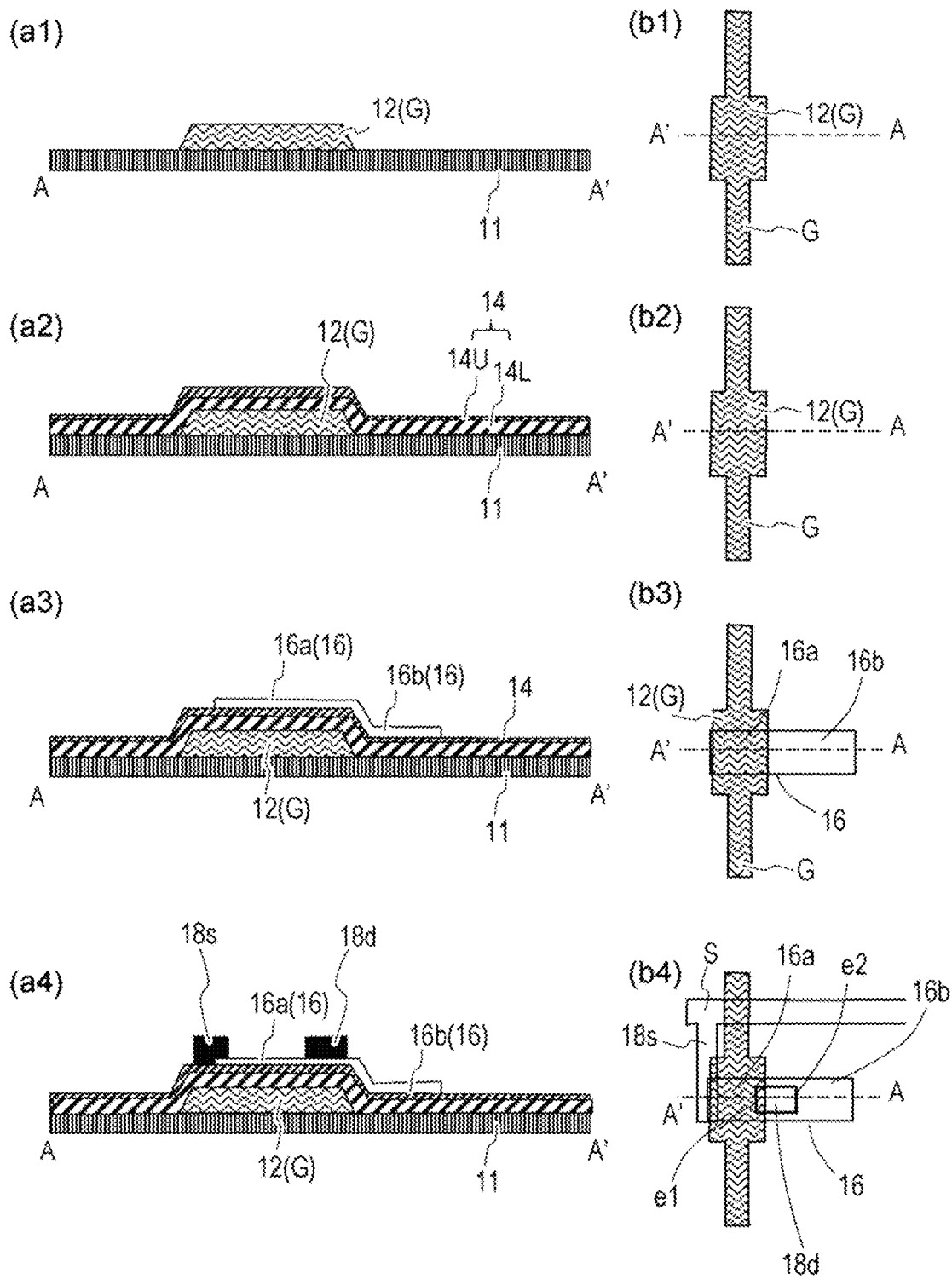
FIGS. 8(a1) to 8(a4) are sectional views illustrating processes of an exemplary method of manufacturing the semiconductor device 100B and FIGS. 8(b1) to 8(b4) are plan views illustrating the processes illustrated in FIGS. 8(a1) to 8(a4).
Figure 9:
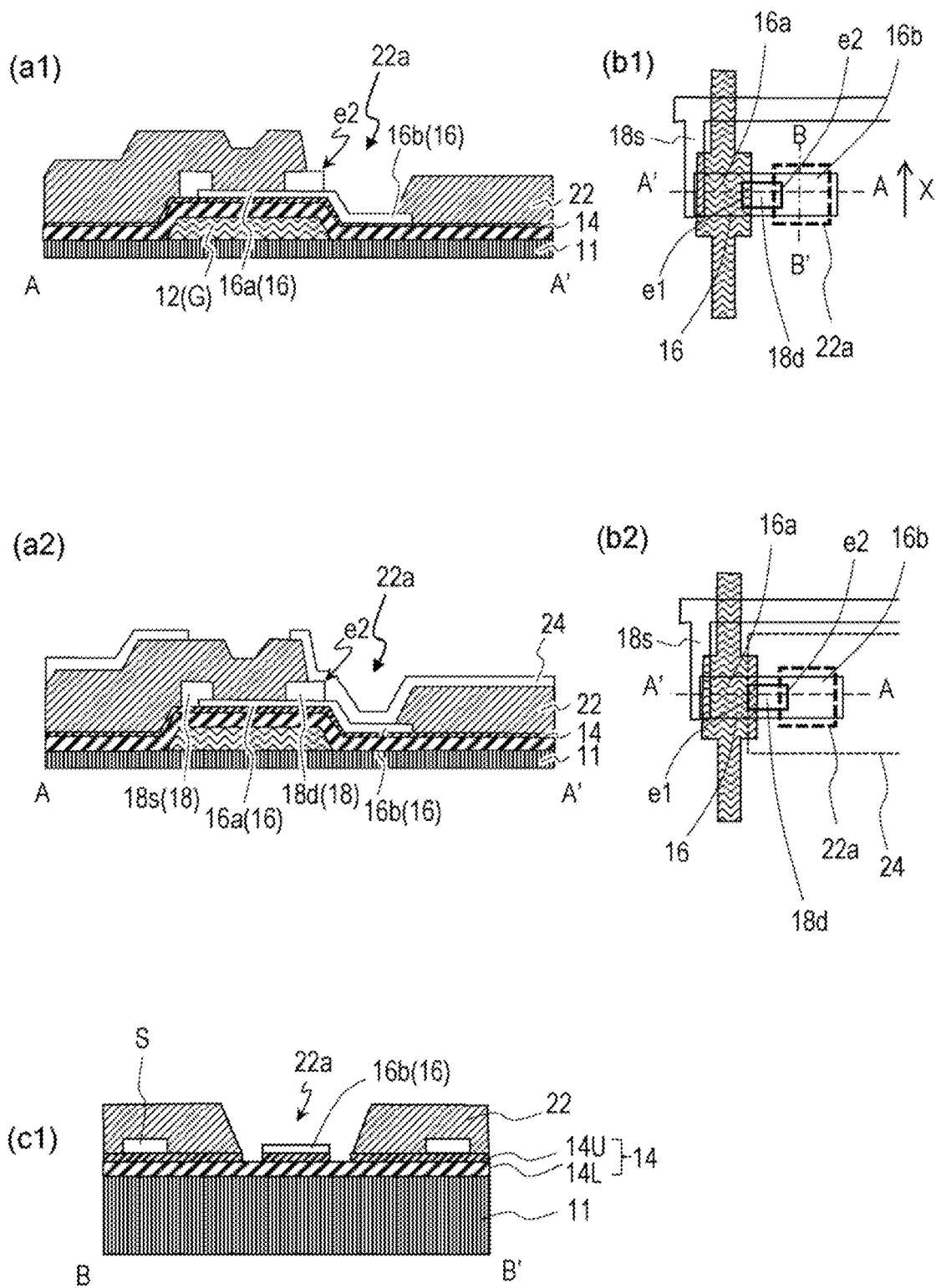
FIGS. 9(a1) and 9(a2) are sectional views illustrating processes of an exemplary method of manufacturing the semiconductor device 100B, FIGS. 9(b1) and 9(b2) are plan views illustrating the processes illustrated in FIGS. 9(a1) and 9(a2), and FIG. 9(c1) is a sectional view taken along the line B-B' in the process illustrated in FIG. 9(b1).

FIGS. 8(a1) to 8(a4) and FIGS. 9(a1) and 9(a2) are schematic sectional views illustrating processes of an exemplary method of manufacturing the semiconductor device 100B and FIGS. 8(b1) to 8(b4) and FIGS. 9(b1) and 9(b2) are plan views illustrating the processes corresponding to FIGS. 8(a1) to 8(a4) and FIGS. 9(a1) and 9(a2), respectively.

First, as illustrated in FIGS. 8(a1) and 8(b1), a gate wiring layer including the gate electrode 12 and the gate wiring G is formed on the substrate 11.

As the substrate 11, for example, a glass substrate, a silicon substrate, or a plastic substrate (resin substrate) with thermal resistance can be used.

The gate electrode 12 and the gate wiring G may be integrated. Here, a gate wiring metal film (for example, a thickness equal to or greater 50 nm and equal to or less than 500 nm) (not illustrated) is formed on the substrate (for example, a glass substrate) 11 by a sputtering method or the like. Subsequently, the gate electrode 12 and the gate wiring G are obtained by patterning the gate wiring metal film. As the gate wiring metal film, for example, a film including a metal such as aluminum (Al), tungsten (W), molybdenum (Mo), tantalum (Ta), chrome (Cr), titanium (Ti), copper (Cu), an alloy thereof, or a metal nitride thereof can be appropriately used. A laminate film in which a plurality of film among the films are laminated may be used. Here, for example, a laminate film (W/TaN) in which a W film (a thickness of 5 to 500 nm) is an upper layer and a TaN (a thickness of 5 to 100 nm) is a lower layer is used.

Next, as illustrated in FIGS. 8(a2) and (b2), the gate insulation layer 14 is formed to cover the gate wiring G and the gate electrode 12. As the gate insulation layer 14, a silicon oxide ($SiO_2$) layer, a silicon nitride (SiNx) layer, a silicon nitride oxide (SiOxNy; x>y) layer, a silicon oxide nitride (SiNxOy; x>y) layer, or the like can be appropriate used. The gate insulation layer 14 may have a laminate structure in which a lower layer 14L and an upper layer 14U are laminated from the side of the substrate 11. For example, a silicon nitride layer, a silicon oxide nitride, or the like may be formed as the lower layer 14L to suppress diffusion of impurities or the like from the substrate 11. A silicon oxide layer, a silicon oxide nitride, or the like may be formed as the upper layer 14U to ensure insulation. When a layer including oxygen (for example, a metal oxide layer such as $SiO_2$) is used as an uppermost layer (a layer coming into contact with a metal oxide) of the gate insulation layer 14, oxygen deficiency of the metal oxide layer can be restored by the oxygen included in the gate insulation layer 14 in a case in which the oxygen deficiency occurs in the metal oxide layer. Therefore, it is possible to efficiently reduce the oxygen deficiency of the metal oxide layer. Here, the gate insulation layer 14 that has the laminate structure in which a silicon nitride (SiNx) layer (a thickness: 100 to 500 nm) is the lower layer 14L and a silicon oxide ($SiO_2$) layer (a thickness: 20 to 100 nm) is the upper layer 14U is formed using, for example, a CVD method.

Next, as illustrated in FIGS. 8(a3) and (b3), for example, an oxide semiconductor film (a thickness equal to or greater than 20 nm and equal to or less than 200 nm, for example) is stacked on the gate insulation layer 14 using, for example, a sputtering method. Subsequently, the island-shaped, metal oxide layer 16 is formed by patterning the oxide semiconductor film. When viewed in the normal direction of the substrate 11, a part of the metal oxide layer 16 is disposed to overlap the gate electrode 12 via the gate insulation layer 14. Here, for example, the metal oxide layer 16 is formed by patterning an In—Ga—Zn—O-based oxide semiconductor film (a thickness of 50 nm, for example) in which In, Ga, and Zn are included at a ratio of 1:1:1. The metal oxide layer 16 formed in this way is configured of an oxide semiconductor, but is partially conducted by bringing the metal oxide layer 16 into contact with a conductor in a subsequent process in some cases.

In the illustrated example, the metal oxide layer 16 extends to cross the edge of the gate electrode 12 from the gate electrode 12 when viewed in the normal direction of the substrate 11. In the metal oxide layer 16, a portion overlapping the gate electrode 12 via the gate insulation layer 14 is referred to as a "first portion 16a" and a portion not overlapping the gate electrode 12 is referred to as a "second portion 16b".

Here, the metal oxide layer 16 used in the embodiment will be described. An oxide semiconductor included in the metal oxide layer 16 may be an amorphous oxide semiconductor or may be a crystalline oxide semiconductor including a crystalline portion. As the crystalline oxide semiconductor, a polycrystalline oxide semiconductor, a microcrystal semiconductor, or a crystalline oxide semiconductor in which a c axis is aligned to be approximately vertical to a layer surface is exemplified.

The metal oxide layer 16 may have a laminate structure of 2 or more layers. In a case in which the metal oxide layer 16 has the laminate structure, the metal oxide layer 16 may include an amorphous oxide semiconductor layer and a crystalline oxide semiconductor layer. Alternatively, the metal oxide layer 16 may include a plurality of crystalline oxide semiconductor layers with different crystal structures. In a case in which the metal oxide layer 16 has a two-layered laminate structure including an upper layer and a lower layer, an energy gap of the oxide semiconductor included in the upper layer is preferably greater than an energy gap of the oxide semiconductor included in the lower layer. Here, in a case in which a difference between the energy gaps of these layers is relatively small, the energy gap of the oxide semiconductor of the lower layer may be greater than the energy gap of the oxide semiconductor of the upper layer.

The configuration or the like of the oxide semiconductor layer that has the material, the structure, the film forming method, and the laminate structure of the amorphous oxide semiconductor and each crystalline oxide semiconductor is disclosed in, for example, Japanese Unexamined Patent Application Publication No. 2014-007399. Priority is claimed on Japanese Unexamined Patent Application Publication No. 2014-007399, the content of which is incorporated herein by reference.

The metal oxide layer 16 may include, for example, at least one kind of metal element among In, Ga, and Zn. In the embodiment, the metal oxide layer 16 includes, for example, an In—Ga—Zn—O-based semiconductor. Here, the In—Ga—Zn—O-based semiconductor is a ternary oxide of indium (In), gallium (Ga), and zinc (Zn). The ratio (composition ratio) of In, Ga, and Zn is not particularly limited and include, for example, In: Ga: Zn=2:2:1, In: Ga: Zn=1:1:1, or In: Ga: Zn=1:1:2. The metal oxide layer 16 can be formed of an oxide semiconductor film including the In—Ga—Zn—O-based oxide semiconductor. A channel-etch type TFT that has the active layer including the In—Ga—Zn—O-based semiconductor is referred to as a "CE-In-GaZnO-TFT" in some cases.

The In—Ga—Zn—O-based semiconductor may be amorphous or crystalline. As the crystalline In—Ga—Zn—O-based semiconductor, a crystalline In—Ga—Zn—O-based semiconductor which a c axis is aligned to be approximately vertical to the layer surface.

The crystal structure of the crystalline In—Ga—Zn—O-based semiconductor is disclosed in, for example, Japanese Unexamined Patent Application Publication No. 2014-007399 described above, Japanese Unexamined Patent Application Publication No. 2012-134475, and Japanese Unexamined Patent Application Publication No. 2014-209727. Priority is claimed on Japanese Unexamined Patent Application Publication No 2012-134475 and Japanese Unexamined Patent Application Publication No. 2014-209727, the content of which is incorporated herein by reference. Since a TFT having the In—Ga—Zn—O-based semiconductor layer has high mobility (greater 20 times than a-SiTFT) and low leakage current (less 1/100 than a-SiTFT), the TFT is used appropriately as a driving TFT and a pixel TFT.

The metal oxide layer 16 may include another oxide semiconductor instead of the In—Ga—Zn—O-based semiconductor. For example, the metal oxide layer 16 may include the In—Ga—Zn—O-based semiconductor (for example. $In_2O_3$—$SnO_2$—$ZnO$). The In—Ga—Zn—O-based semiconductor is a ternary oxide of indium (In), tin (Sn), and zinc (Zn). Alternatively, the metal oxide layer 16 may include an In—Al—Zn—O-based semiconductor, art In—Al—Sn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), a Mg—Zn—O-based semiconductor, an In—Ga—Sn—O-based semiconductor, an In—Ga—O-based semiconductor, a Zr—In—Zn—-based semiconductor, or a Hf—In—Zn—O-based semiconductor.

Next, as illustrated in FIGS. 8(*a*4) and (*b*4), a source wiring metal film (a thickness equal to or greater than 50 nm and equal to or less than 500 nm) is formed on the metal oxide layer 16 and the gate insulation layer 14. A source wiring layer including the source wiring S, the source electrode 18*s*, and the drain electrode 18*d* is formed by patterning the source wiring metal film. The source electrode 18*s* and the drain electrode 18*d* are disposed to be separated and face the first portion 16*a* of the metal oxide layer 16 and each come into contact with the upper surface of the first portion 16*a*. The drain electrode 18*d* is disposed to also come into contact with the upper surface of the second portion 16*b*. In this example, when viewed in the normal direction of the substrate 11, the source wiring S includes a portion extending in the column direction and an extension portion extending in the row direction from the portion extending in the column direction. The extension portion is also disposed on the upper surface of the metal oxide layer 16 and functions as the source electrode 18*s*. The drain electrode 18*d* extends to cross the edge of the gate electrode 12 from the first portion 16*a* and comes into contact with the upper surface of the second portion 16*b* of the metal oxide layer 16.

As the source wiring metal film, a film including metal such as aluminum (Al), tungsten (W) molybdenum (Mo), tantalum (Ta), copper (Cu), chrome (Cr), titanium (Ti), an alloy thereof, or a metal nitride thereof can be appropriately used. A laminate film in which a plurality of film among the films are laminated may be used. Here, for example, a laminate film (Ti/Al/Ti) in which a Ti film (a thickness: 10 to 100 nm), an Al film (a thickness: 50 to 400 nm), and a Ti film (a thickness: 50 to 300 nm) from the side of the substrate n are stacked in this order is used.

Thereafter, an oxidation process may be performed on a portion which serves as the channel region of the metal oxide layer 16. As the oxidation process, for example, plasma treatment using an $N_2O$ gas may be performed.

Subsequently, as illustrated in FIGS. 9(*a*1) and 9(*b*1), the inter-layer insulation layer 22 is formed to cover the source wiring layer. Thereafter, the contact hole 22*a* exposing the drain electrode 18*d*, the second portion 16*b* of the metal oxide layer 16, and the gate insulation layer 14 is formed in the inter-layer insulation layer 22.

The same material as the gate insulation film can be used as the material of the inter-layer insulation layer 22. The inter-layer insulation layer 22 may be a single layer or may have a laminate structure. Preferably, the inter-layer insulation layer 22 is formed using an inorganic insulation film. The inter-layer insulation layer 22 may be formed using an organic insulation film or may have, for example, a laminate structure of an organic insulation film and an inorganic insulation film. However, when the organic insulation film is used, the thickness of the inter-layer insulation layer 22 increases and the contact hole 22*a* becomes deeper in some cases. Here, as the inter-layer insulation layer 22, for example, a $SiO_2$ film (a thickness: 50 to 1000 nm) is formed by a CVD method. After the inter-layer insulation layer 22 is formed, thermal treatment (annealing process) may be performed on the entire substrate 11. A temperature of the thermal treatment is not particularly limited. For example the temperature may be equal to or greater than 200° C. and equal to or less than 400° C. Thereafter, a silicon nitride (SiNx) layer (a thickness: 50 to 1000 nm) may be formed.

The contact hole 22*a* is formed by dry-etching or wet etching. As illustrated in FIG. 9(*b*1), the contact hole 22*a* is disposed to expose the front surface of the second portion 16*b* of the metal oxide layer 16, the edge e2 of the drain electrode 18*d* located on the second portion 16*b*, and the gate insulation layer 14. As illustrated, the width of the contact hole 22*a* in the row direction (the X direction and the channel width direction herein) may be greater than the width of the second portion 16*b* of the metal oxide layer 16 in the row direction and the width of the drain electrode 18*d* in the row direction. When viewed in the normal direction of the substrate 11, the circumference of the contact hole 22*a* may extend to cross two edges of the second portion 16*b* extending in the row direction.

In the embodiment, when the contact hole 22*a* is formed, an etching method and conditions are selected so that an etching rate of the inter-layer insulation layer 22 is less than an etching rate of the metal oxide layer 16. Thus, most of the second portion 16*b* of the metal oxide layer 16 and the drain electrode 18*d* are not etched and remain.

A portion of the front surface of the gate insulation layer 14 is etched (overetched) at the time of forming the contact hole 22*a* by the material of the gate insulation layer 14 in some cases.

FIG. 9(*c*1) is a schematic sectional view taken along the line B-B' of FIG. 9(*b*1) and exemplifying a case in which the gate insulation layer 14 is overetched. Here, both of the inter-layer insulation layer 22 and the upper layer 14U of the gate insulation layer 14 include $SiO_2$. Therefore, at the time of etching the inter-layer insulation layer 22, the $SiO_2$ layer which is the upper layer 14U of the gate insulation layer 14 is also etched in some cases. Here, by using an etching condition that the etching rate of the $SiO_2$ layer is greater than the etching rate of the SiNx layer which is the lower layer of the gate insulation layer 14, as exemplified in FIG.(c1), an overetching amount of the gate insulation layer 14 can be suppressed to be equal to or less than the thickness of the upper layer (the SiO₂ layer) 14U.

Next, as illustrated in FIGS. 9(a2) and (b2), a first transparent conductive film (a thickness: 20 to 300 nm) is formed on the inter-layer insulation layer 22 and in the contact hole 22a, and the transparent conductive layer 24 is formed by patterning the first transparent electrode film. A metal oxide such as ITO, IVO, or ZnO can be used as the material of the first transparent electrode film.

Here, for example, an IZO film (a thickness: 20 to 300 nm) is formed as the first transparent conductive film by a sputtering method. Thereafter, the transparent conductive layer 24 is formed by patterning the IZO film using a photolithography process. The transparent conductive layer 24 is disposed to come into contact with the upper surface and the side surface of the drain electrode 18d, the second portion 16b of the metal oxide layer 16, and the upper surface of the gate insulation layer 14 in the contact hole 22a.

Subsequently, the insulation layer 26 and the upper transparent conductive layer 28 are formed on the transparent conductive layer 24 see FIGS. 7(a) to 7(c)).

As a material of the insulation layer 26, the same inorganic insulation material as the gate insulation layer 14 can be used. The insulation layer 26 may be a laminate film. Here, for example, a SiNx film (a thickness: 50 to 500 nm) is formed by CVD.

The upper transparent conductive layer 28 can be obtained by forming a second transparent electrode film on the insulation layer 26 and patterning the second transparent electrode film. As a material of the second transparent electrode film, the same material as the first transparent electrode film can be used. Here, for example, an IZO film (a thickness: 20 to 300 nm) is formed by a sputtering method. Thereafter, the upper transparent conductive layer 28 is formed by patterning the second transparent electrode film using a photolithography process. In the upper transparent conductive layer 28, at least one opening portion (or a notch portion) 28E may be formed for each pixel. In this way, the semiconductor device 100B is manufactured.

(Second Embodiment)

Hereinafter, the structure of a semiconductor device according to a second embodiment of the invention will be described with reference to the drawings.

Figure 10:
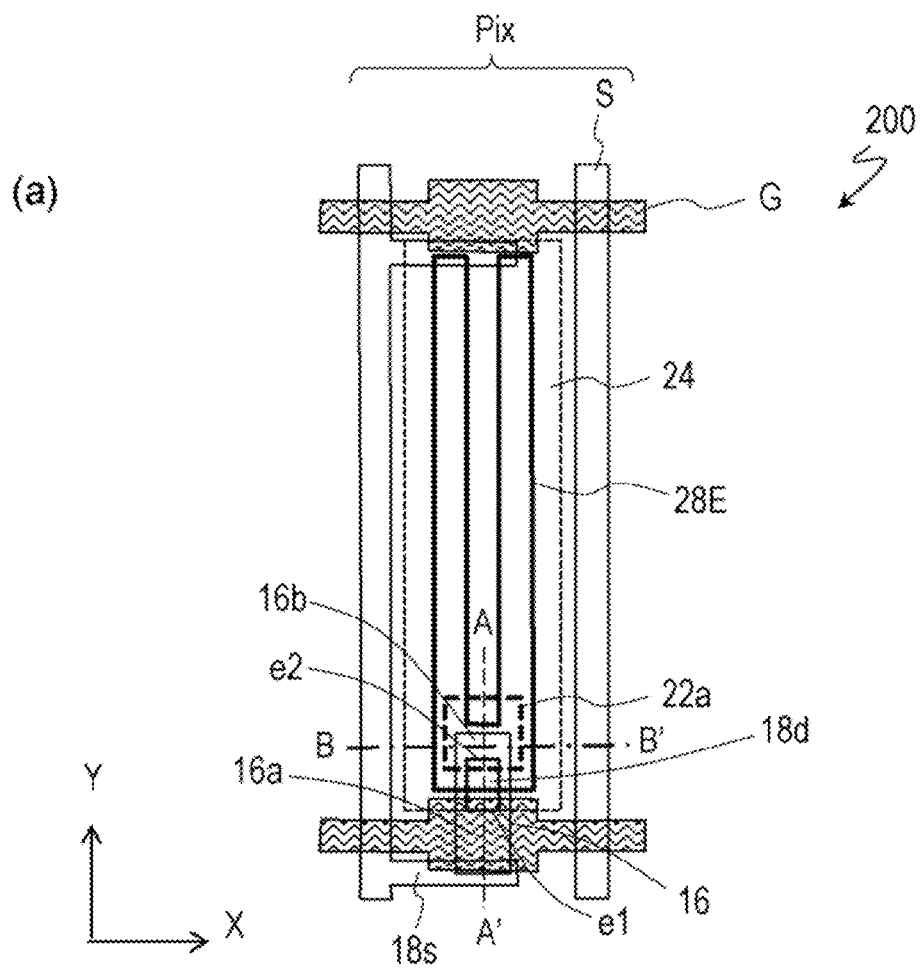
FIGS. 10(a) and 10(b) are schematic plan and sectional views illustrating a semiconductor device 200 according to a second embodiment.
Figure 10:
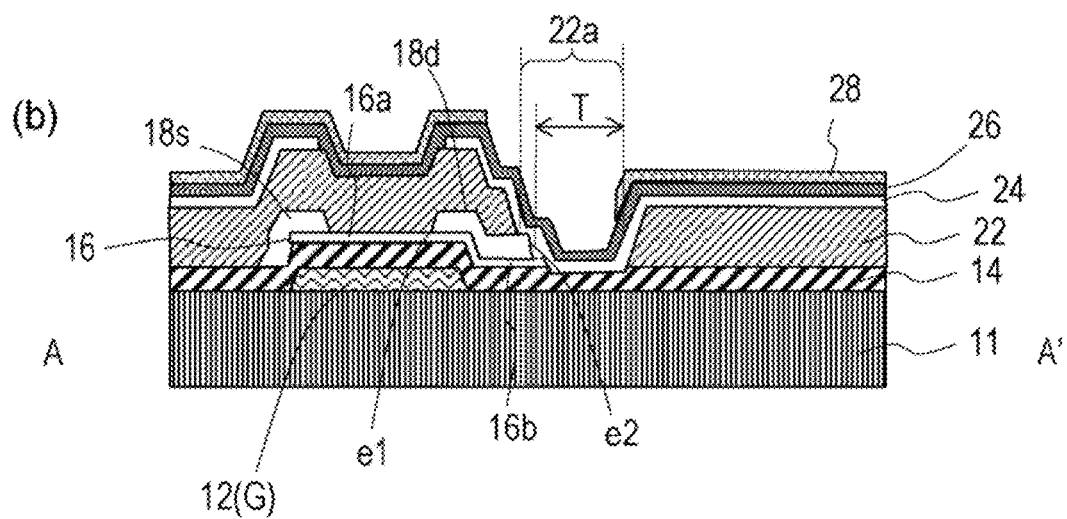

FIG. 10 is a diagram schematically illustrating the structure of a semiconductor device 200 according to the second embodiment of the invention. FIG. 10(a) is a schematic plan view and FIG. 10(b) is a schematic sectional view taken along the line A-A' illustrated in FIG. 10(a). The cross-sectional structure taken along the line B-B' is the sane as the structure illustrated in FIG. 1(c), and thus is not illustrated.

The semiconductor device 200 is different from the semiconductor device 100B illustrated in FIG. 7 in that the width of the second portion 16b of the metal oxide layer 16 in the column direction is reduced. The other remaining structure is the same as that of the semiconductor device 100B, and thus the description thereof will be omitted.

In the semiconductor device 200, as illustrated in FIG. 10(b), when viewed in the normal direction of the substrate 11, the metal oxide, layer 16 extends to cross the edge of the gate electrode 12 from the gate electrode 12. The edge e2 on the side of the second portion 16b not overlapping the gate electrode 12 in the metal oxide layer 16 overlaps with the contact hole 22a formed in the inter-layer insulation layer 22.

Figure 11:
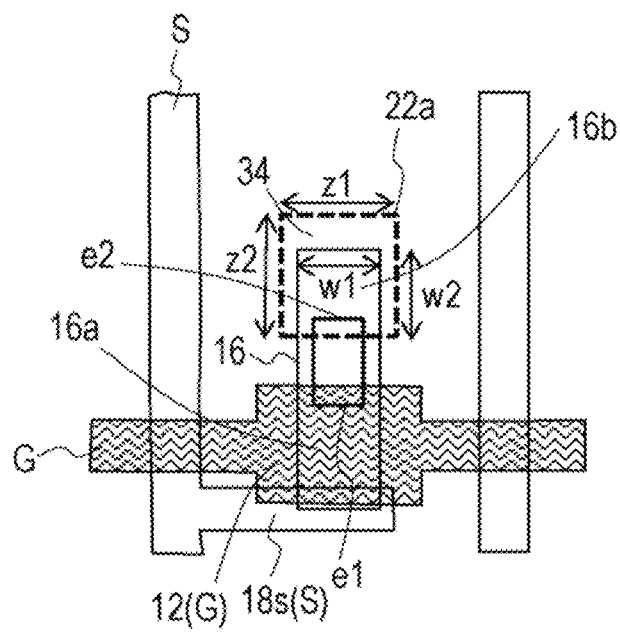
FIG. 11 is an enlarged plan view exemplifying a contact portion in the semiconductor device 200.

FIG. 11 is an enlarged plan view exemplifying a contact portion in the semiconductor device 200. As understood from FIG. 11, when viewed in the normal direction of the substrate 11, a width w2 of a portion overlapping the contact hole 22a in the column direction in the metal oxide layer 16 is less than a width z2 of the contact hole 22a in the column direction.

Therefore, a portion 34 adjacent to the edge 2 of the second portion 16b of the metal oxide layer 16 in the column direction in the gate insulation layer 14 is exposed by the contact hole 22a and comes into contact with the transparent conductive layer 24. As illustrated in FIG. 10(a), the front surface of the portion 34 of the gate insulation layer 14 is overetched in some cases. Even in this case, a step difference of the contact hole 22a can be suppressed by controlling the thickness of the inter-layer insulation layer 22, an overetching amount, and the like or light leakage by disarray of liquid crystal alignment can be suppressed by using an optical alignment film.

The semiconductor device 200 has only a different pattern of the metal oxide layer 16, and thus can be manufactured according to the same method as the semiconductor device 100B. A preferable range of the ratio between the areas of the contact region Rc in the contact portion and the light-shielding region Rd may also be same as that of the first embodiment.

Even in the embodiment, as in the above-described embodiment, it is possible to further suppress the deterioration in the aperture ratio by the drain electrode 18d while suppressing the contact resistance. Since the area of the metal oxide layer 16 which underlies the contact hole 22a can be set to be small, it is possible to reduce the size of the pixel Pix.

(Third Embodiment)

Hereinafter, the structure of a semiconductor device according to a third embodiment of the invention will be described with reference to the drawings.

Figure 12:
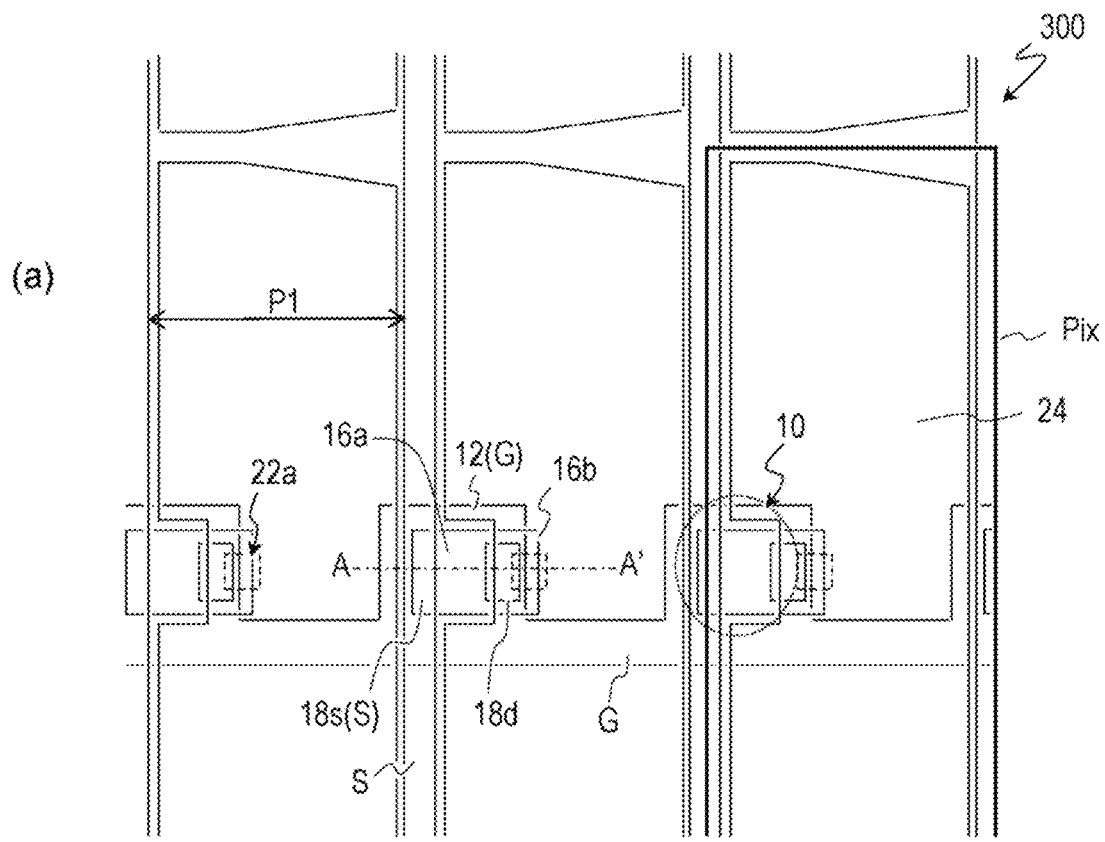
FIGS. 12(a) and 12(b) are schematic plan and sectional views illustrating a semiconductor device 300 according to a third embodiment.
Figure 12:
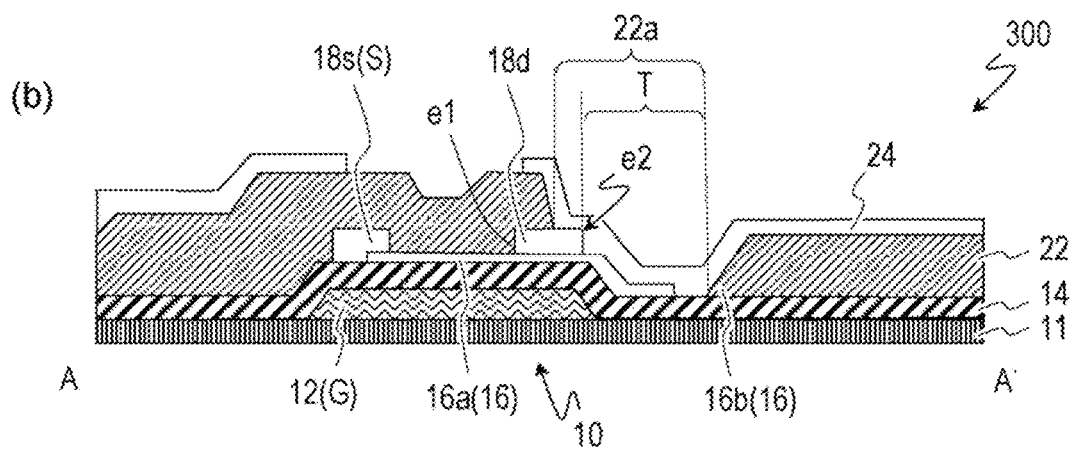

FIG. 12 is a diagram schematically illustrating the structure of a semiconductor device 300 according to the third embodiment of the invention. FIG. 12(a) is a schematic plan view and FIG. 12(b) is a schematic sectional view taken along the line A-A' illustrated in FIG. 12(a).

The semiconductor device 300 has the TFT horizontal structure described above with reference to FIG. 2(b). That is, the source electrode 18s, the channel region of the metal oxide layer 16, and the drain electrode 18d are arrayed in this order in the row direction. The contact hole 22a of the inter-layer insulation layer 22 is disposed to be adjacent to the drain electrode 18d of the oxide semiconductor TFT 10. Accordingly, the contact hole 22a and the oxide semiconductor TFT 10 are arrayed in the row direction. The other remaining configuration may be the same as that of the semiconductor device 100A illustrated in FIG. 1.

When viewed in the normal direction of the substrate 11, the metal oxide layer 16 includes a portion 16a overlapping the, gate electrode 12 and a portion 16b not overlapping the gate electrode 12. In this example, the metal oxide layer 16 extends to cross the edge of the gate electrode 12 from the gate electrode 12 in the row direction. A part of the source wiring S comes into contact with a part of the first portion 16a of the metal oxide layer 16 and functions as the source electrode 18s. The drain electrode 18d comes into contact with the first portion 16a of the metal oxide layer 16, leaving a gap with the source electrode 18s. The drain electrode 18d extends from the first portion 16a to the second portion 16b and also comes into contact with the second portion 16b. The width of the metal oxide layer 16 in the column direction may be greater than the width of the drain electrode 18d in the column direction.

The contact hole 22a is disposed to overlap with the edge e2 opposite to the channel region of the drain electrode 18d. The contact hole 22a is disposed to expose the drain electrode 18d, the second portion 16b of the metal oxide layer 16, and the gate insulation layer 14. The transparent conductive layer 24 comes into direct contact with the drain electrode 18d, the second portion 16b of the metal oxide layer 16, and the gate insulation layer 14 in the contact hole 22a.

The semiconductor device 300 can be manufactured according to the same method as the semiconductor device 100A. A preferable range of the ratio between the areas of the contact region Rc in the contact portion and the light-shielding region Rd may also be same as that of the first embodiment.

Even in the embodiment, as in the above-described embodiment, it is possible to further suppress the deterioration in the aperture ratio by the drain electrode 18d while suppressing the contact resistance. Since the area of the metal oxide layer 16 which underlies the contact hole 22a can be set to be small, it is possible to reduce the size of the pixel Pix.

The width w1 of the portion in the row direction in which the contact hole 22a overlaps the second portion 16b of the metal oxide layer 16 may be less than the width z1 of the contact hole 22a in the row direction. Thus, it is possible to further reduce the width (the pixel pitch) P1 of the pixel Pix in the row direction.

The configuration of the semiconductor device according to the embodiment is not limited to the illustrated configuration. For example, the semiconductor device 300 may further includes an upper transparent conductive layer disposed on the transparent conductive layer 24 via an insulation layer.

A disposition relation between the metal oxide layer 16 or the oxide semiconductor TFT 10 and the contact hole 22a may be a relation in which a part of the contact hole 22a overlaps the second portion 16b of the metal oxide layer 16 when viewed in the normal direction of the substrate 11, and is not limited to the illustrated example. As illustrated in FIG. 4(b), the contact hole 22a and the oxide semiconductor TFT 10 may be deviated from each other in the column direction.

(Fourth Embodiment)

Hereinafter, the structure of a semiconductor device according to a fourth embodiment of the invention will be described with reference to the drawings.

Figure 13:
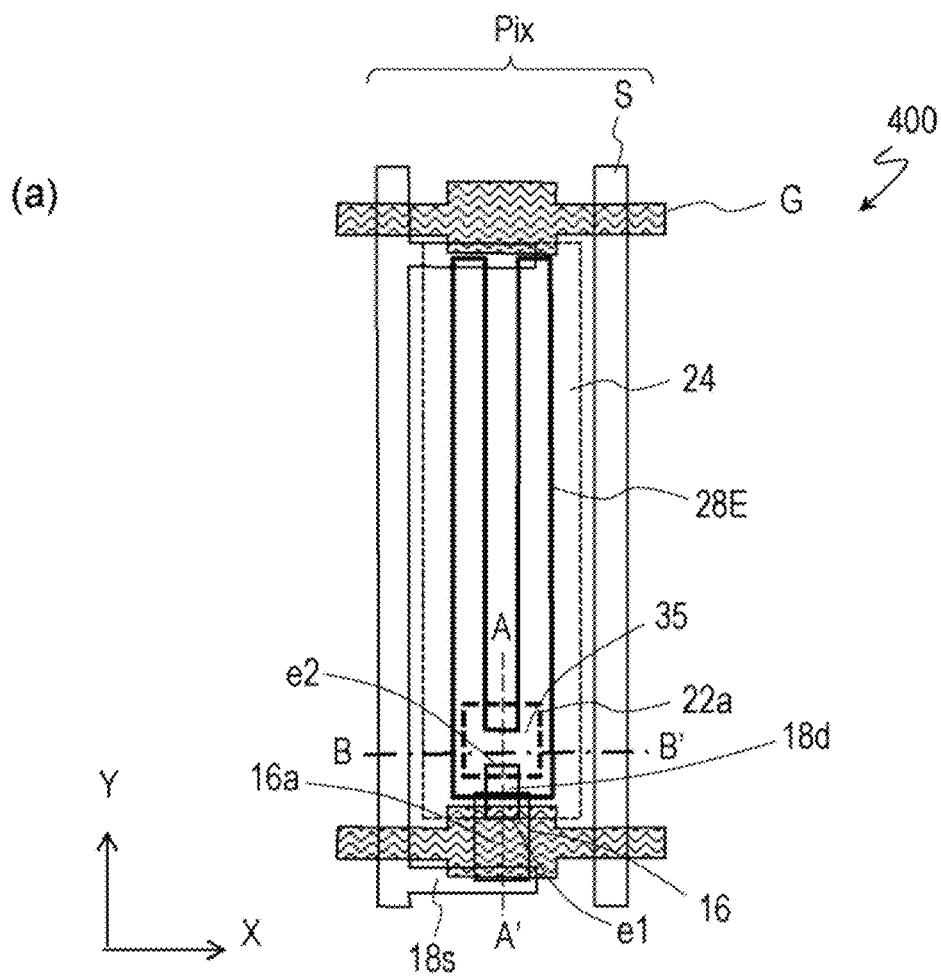
FIGS. 13(a) and 13(b) are schematic plan and sectional views illustrating a semiconductor device 400 according to a fourth embodiment.
Figure 13:
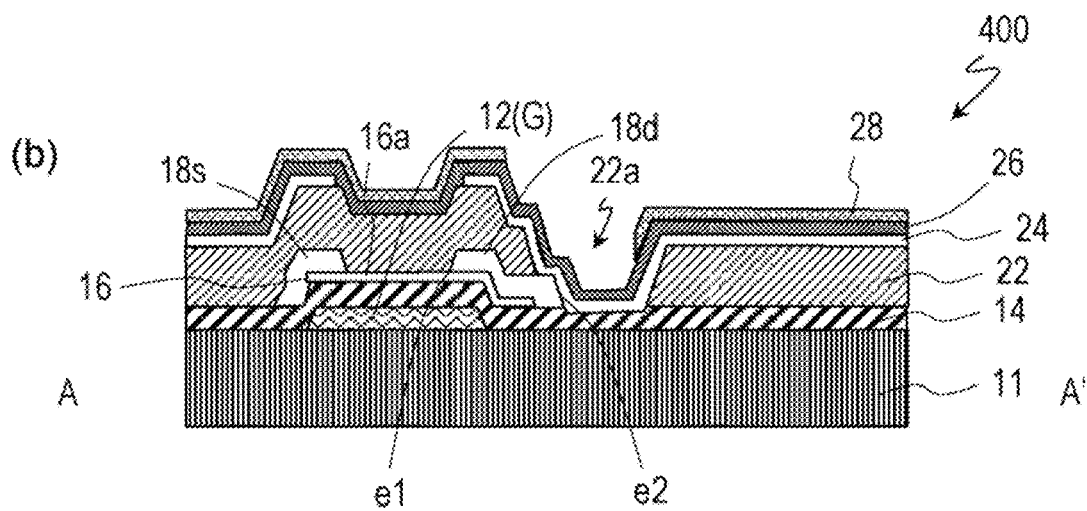

FIG. 13 is a diagram schematically illustrating the structure of a semiconductor device 400 according to the fourth embodiment of the invention. FIG. 13(a) is a schematic plan view and FIG. 13(b) is a schematic sectional view taken along the line A-A' illustrated in. FIG. 13(a). The cross-sectional structure taken along the line B-B' is the same as the structure illustrated in FIG. 1(c), and thus is not illustrated.

In the semiconductor device 400, the width of the second portion 16b of the metal oxide layer 16 in the column direction is further reduced than in the semiconductor device 200 illustrated in FIG. 10. When viewed in the normal direction of the substrate 11 the second portion 16b does not overlap the contact hole 22a.

In the illustrated example, when viewed in the normal direction of the substrate 11, the metal oxide layer 16 extends to cross the edge of the gate electrode 12 from the gate electrode 12. The drain electrode 18d extends to cross the edge of the gate electrode 12 and the edge of the second portion 16b in the metal oxide layer 16 from the gate electrode 12. The contact hole 22a is disposed to expose the gate insulation layer 14 and the edge e2 opposite to the channel region of the drain electrode 18d. The second portion 16b of the metal oxide layer 16 is not exposed by the contact hole 22a. Here, when viewed in the normal direction of the substrate 11, an end on the side of the second portion 16b of the metal oxide layer 16 is located between the contact hole 22a and the gate electrode 12. The other remaining configuration may be the same as that of the semiconductor device 200 illustrated in FIG. 10.

The semiconductor device 400 has only a different pattern of the metal oxide layer 16, and thus can be manufactured according to the same method as the semiconductor device 100B.

Even in the embodiment, as in the above-described embodiment, it is possible to ensure the contact area since the transparent conductive layer 24 comes into contact with not only the upper surface but also the side surface of the drain electrode 18d. Accordingly, it is possible to further suppress the deterioration in the aperture ratio by the drain electrode 18d while suppressing the contact resistance. Since the underlying layer (here, the drain electrode 18d) of the contact hole 22a can be set to be small, the fine pixel pitch can be realized.

Figure 14:
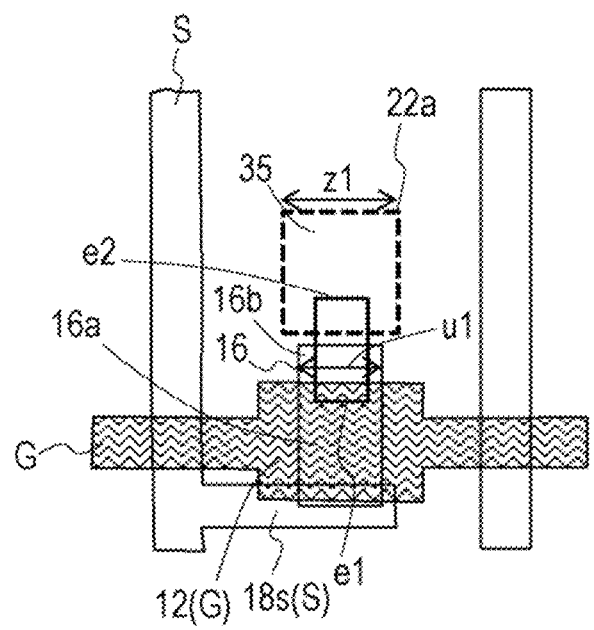
FIG. 14 is an enlarged plan view exemplifying a contact portion in the semiconductor device 400.

FIG. 14 is an enlarged plan view exemplifying a contact portion in the semiconductor device 400. In the embodiment, in a region in which the contact portion is formed, the metal oxide layer 16 which functions as an etch stop is not disposed on the gate insulation layer 14. Therefore, a portion 35 which does not come into contact with the drain electrode 18d in the gate insulation layer 14 is exposed by the contact hole 22a and comes into contact with the transparent conductive layer 24. As illustrated in FIG. 13(b), the front surface of the portion 35 of the gate insulation layer 14 is overetched in some cases. Even in this case, a step difference of the contact hole 22a can be suppressed by controlling the thickness of the inter-layer insulation layer 22, an overetching amount, and the like or light leakage by disarray of liquid, crystal alignment can be suppressed by using an optical alignment film.

A width u1 of the second portion 16b of the metal oxide layer 16 in the row direction and a width of the drain electrode 18d in the row direction are preferably less than the width z1 of the contact hole 22a in the row direction. Thus, it is possible to further decrease the pixel pitch P1 while ensuring a sufficient gap between the source wiring S, and the second portion 16b of the metal oxide layer 16 and the drain electrode 18d.

In the semiconductor device 400, when viewed in the normal direction of the substrate 11, a ratio at which the area of a region (light-shielding region) in which the drain electrode 18d overlaps the contact hole a occupies the entire opening region Ra of the contact hole 22a may be equal to or less than, for example, 50%. Thus, it is possible to further improve the pixel aperture ratio. On the other hand, the ratio may be equal to or greater than, for example 20%. Thus, it is possible to suppress an increase in the contact resistance.

FIG. 13 exemplifies the semiconductor device 400 that has the TFT vertical structure, but the semiconductor device according to the embodiment may have the TFT horizontal structure. Even in this case, the second portion of the metal oxide layer may be disposed not to be exposed by the contact hole, and the transparent conductive layer may come into contact with the drain electrode and the gate insulation layer in the contact hole. For example, the width of the second portion of the metal oxide layer in the row direction may be reduced more than in the semiconductor device 300 (FIG. 12).

(Fifth Embodiment)

A fifth embodiment of the invention is a liquid crystal display apparatus that has a semiconductor device (TFT substrate) according to the above-described embodiments.

Figure 15:
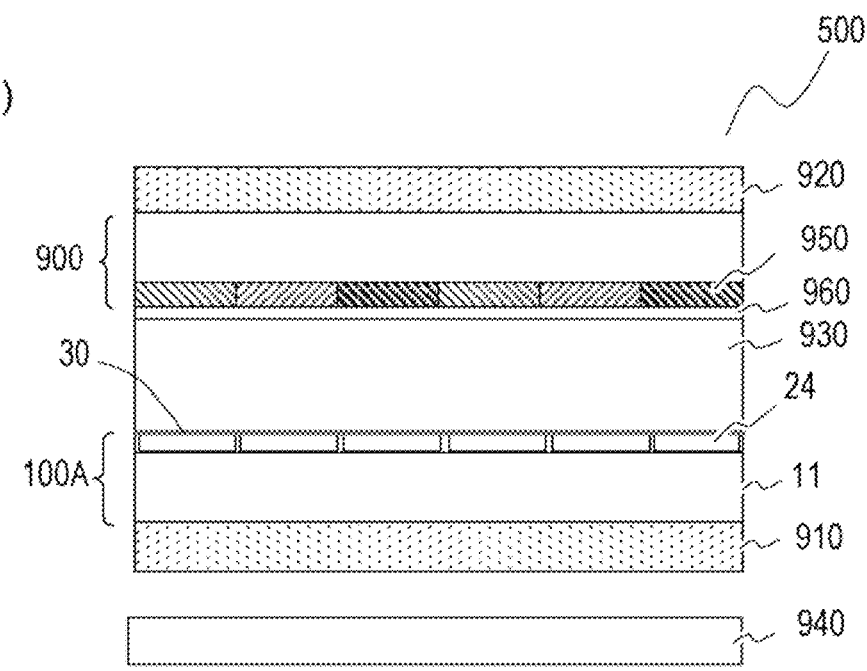
FIG. 15(a) is a schematic sectional view exemplifying a liquid crystal display apparatus 500 according to a fifth embodiment and FIG. 15(b) is an enlarged sectional view illustrating a contact portion in one pixel.
Figure 15:
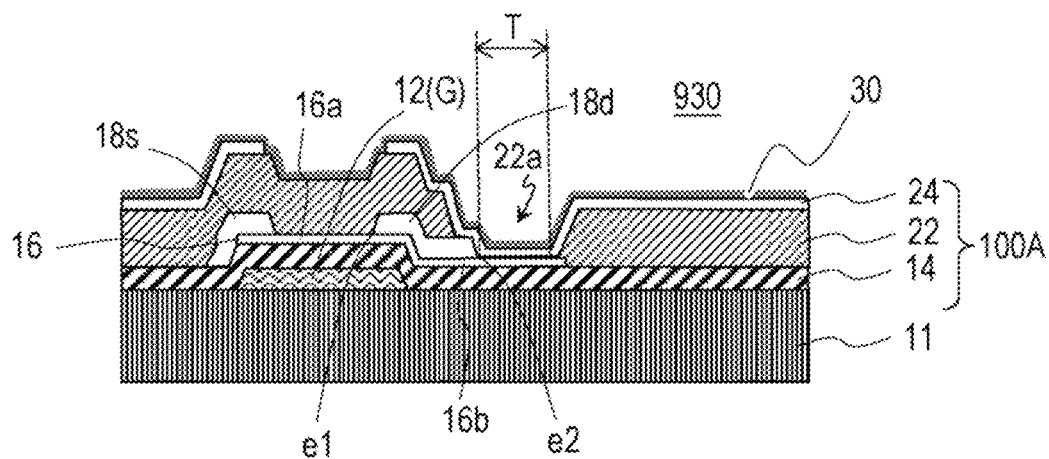

FIG. 15(*a*) is a schematic sectional view exemplifying a liquid crystal display apparatus 500 according to the embodiment and FIG. 15(*b*) is an enlarged sectional view illustrating a contact portion in one pixel.

The liquid crystal display apparatus 500 includes the semiconductor device 100A (FIG. 1) according to the first embodiment, a counter substrate 900 disposed to face the semiconductor device 100A, a liquid crystal layer 930 installed between the semiconductor device 100A and the counter substrate 900, polarization plates 910 and 920 disposed outside of the semiconductor device 100A and the counter substrate 900, respectively, and a backlight unit 940 that emits display light toward the semiconductor device 100A. An alignment film 30 is disposed between the semiconductor device 100A and the liquid crystal layer 930.

As illustrated in FIG. 15(*b*), the alignment film 30 is formed to cover the transparent conductive layer (pixel electrode) 24 of each pixel. A part of the alignment film 30 is also disposed in the contact hole 22*a*. In the embodiment, an optical alignment film subjected to an optical alignment process is used as the alignment film 30. The optical alignment film can be formed according to a known method. For example, the optical alignment film is formed by applying the optical alignment film formed of a photosensitive material and radiating polarization ultraviolet light to the optical alignment film. The alignment of liquid crystal molecules can be controlled in accordance with a polarization direction and a radiation intensity of the radiation light.

As described above, in the semiconductor device 100A, when viewed in the normal direction of the substrate 11, a part of a region defined by the contact hole 22*a* is a region (light transmission region) T not shielded from light, winch can contribute to display. Accordingly, the liquid crystal alignment has to be controlled with high precision even on the side surface of the contact hole 22*a*. In a case in which a rubbing process is performed on the alignment film, it is difficult to perform a good alignment process in the contact hole (in a concave portion) depending on the depth of the contact hole. Therefore, in the light transmission region T, there is a possibility of the light leakage occurring due to disarray of the liquid crystal alignment. However, in a case in which the light alignment process is performed on the alignment film 30, a good alignment control process can be applied even to a portion of the alignment film 30 located in the contact hole 22*a*. Accordingly, even when the contact hole 22*a* is deepened, it is possible to control the liquid crystal alignment with higher precision than on the side surface of the contact hole 22*a*. As a result, since the light leakage occurring in the contact portion can be reduced, it is possible to suppress deterioration in a display contrast ratio. Thus, it is possible to improve display quality.

As the TFT substrate of the liquid crystal display apparatus 500, any of the semiconductor device 100B and the semiconductor device 200 to 400 can be used instead of the semiconductor device 100A.

Although not illustrated, a scanning line driving circuit that drives the gate wirings and a signal line driving circuit that drives the source wirings S are disposed in periphery regions of the semiconductor device 100A. The scanning line driving circuit and the, signal line driving circuit are connected to a control circuit disposed outside of the semiconductor device 100A. Under the control of the control circuit, a scanning signal for switching On and OFF of the TFT is supplied from the scanning line driving circuit to the gate wiring G and a display signal (an application voltage to the transparent conductive layer 24 which is a pixel electrode) is supplied from the signal line driving circuit to the source wiring S.

The counter substrate 900 includes a color filter 950. In the case of the three primary color display, the color filter 950 includes a red (R) filter, a green (G) filter, and a blue (B) filter disposed to correspond to the pixels. A counter electrode 960 is disposed on the front surface of the color filter 950 on the side of the liquid crystal layer 930. In a case in which a horizontal electric field mode such as an FFS mode is applied, the counter electrode 960 is omitted. In this case, the counter substrate 900 is manufactured by forming a light-shielding layer (for example, a Ti layer with a thickness of 200 nm), the color filter 950, and an insulation layer (for example, a $SiO_2$ layer with a thickness of 200 nm) in this order on a glass substrate.

In the liquid crystal display apparatus 500, liquid crystal molecules of the liquid crystal layer 930 are aligned for each pixel to realize display according to a potential difference applied between the counter electrode 960 and the transparent conductive layer 24 which is a pixel electrode of the semiconductor device 100A.

(Examination Result, of the Present Inventors)

The present inventors have variously examined the configuration of the contact portion and a manufacturing method therefor in the semiconductor device according to the foregoing, embodiments. Hereinafter, some of the examination result will be described.

<Examination of Step Difference of Contact Hole>

In all the first to fifth embodiments, the light transmission region T is installed in a part of the contact hole 22*a* to contribute to display. In the configuration, disarray of the liquid crystal alignment on the light transmission region T in the contact hole increases, and thus light leakage occurs in some cases. However, for example, when an optical alignment film is used as the alignment film, it is possible to suppress the light leakage more than the alignment film subjected to the rubbing process. By reducing the step difference of the contact hole, it is possible to reduce the light leakage more efficiently.

Accordingly, the present inventors have inspected a relation between the step difference of the contact hole and black luminance (any unit) of display in a liquid crystal display apparatus using the optical alignment film in order to confirm the advantageous effect obtained by reducing the step difference of the contact hole. The measurement was carried out without shielding the contact hole from light by the light-shielding layer of the color filter.

Figure 16:
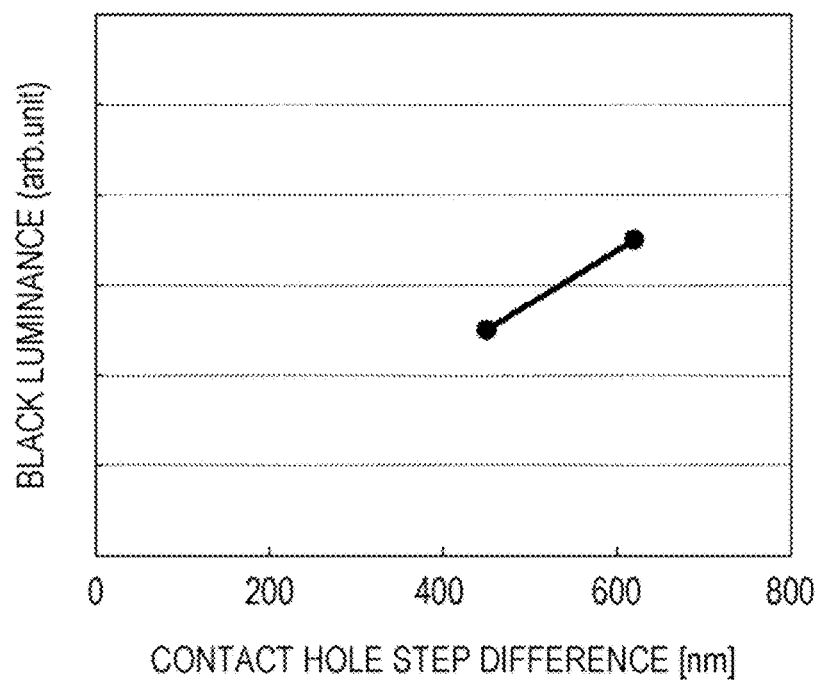
FIG. 16 is a graph exemplifying a relation between a step difference of a contact hole and black luminance of display.

A part of the measurement result is illustrated in FIG. 16. From the result illustrated in FIG. 6, it can be understood that the black luminance is lowered as the step difference of the contact hole is smaller, and thus the light leakage is suppressed. Although not illustrated, according to the examination of the present inventors, it can be confirmed that the black luminance is considerably increased when an alignment film subjected to a rubbing process is used. Even in a case in which the optical alignment film is used, it is confirmed that the black luminance is further increased when the step difference of the contact hole exceeds, for example, 1 μm. When the step difference of the contact hole is equal to or less than 600 nm, it is possible to suppress the light leakage more efficiently. In the embodiment, the contact hole is partially shielded from light by the light-shielding layer of the color filter. Therefore, even in a case in which the step difference of the contact hole is large, the black luminance can be suppressed by adjusting a ratio of the light-shielding region.

<Examination of Disposition of TFTs>

As described with reference to FIGS. 2 to 4, the TFTs may be disposed in the row direction (a TFT horizontal structure) or may be disposed in the column direction (a TFT vertical structure) in the semiconductor device according to an embodiment of the invention. Here, the TFT vertical structure is more preferable than the TFT horizontal structure. The reason will be described.

Figure 17:
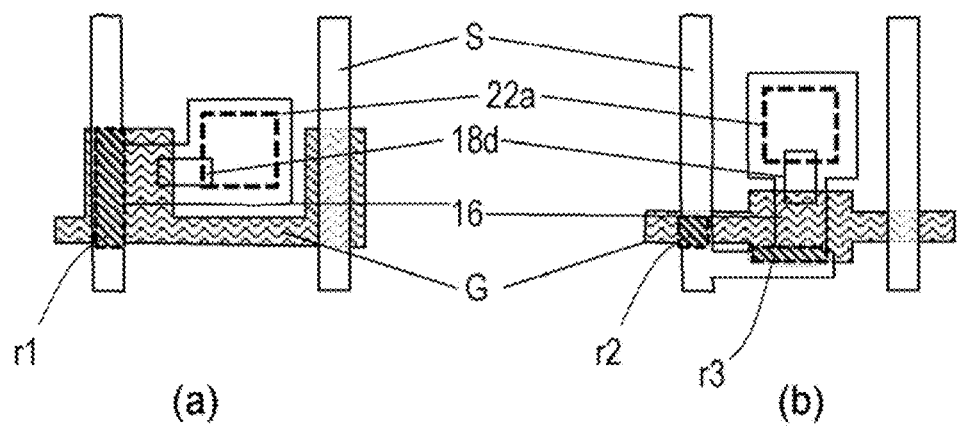
FIGS. 17(a) and 17(b) are plan views exemplifying parasitic capacitance between a source and a drain in a TFT vertical structure and a TFT horizontal structure.

FIGS. 17(a) and 17(b) are plan views exemplifying layouts of the TFT horizontal structure and the TFT vertical structure, respectively. As understood from the drawings, in the TFT vertical structure, areas (overlapping areas) r2 and r3 of portions in which the source wiring S (including the source electrode 18s) and the gate wiring G (including the gate electrode 12) overlap each other via an insulation layer can be set to be less than the overlapping area r1 in the TFT horizontal structure. Therefore, since parasitic capacitance by overlapping between a gate and a source can be reduced, it is possible to reduce a source load and a gate load.

The present inventors have examined and found that the TFT vertical structure has the advantageous effect of reducing deterioration occurring from a negative biased light radiation state (negative biased illuminated stress: NBIS) more than in the TFT horizontal structure. Hereinafter, the examination result will be described in detail.

The present inventors have inspected a change in TFT characteristics occurring in NBIS in a case in which the TFT is disposed in the row direction in a pixel (the TFT horizontal structure) and in a case in which the TFT is disposed in the column direction in a pixel (the TFT vertical structure). Here, a change in a threshold before and after an operation experiment was obtained by carrying out the operation experiment in a state in which −14 V is applied as negative biased stress in the dry air of 70° C. and white light is radiated as light radiation stress from a backlight to each TFT.

Figure 18:
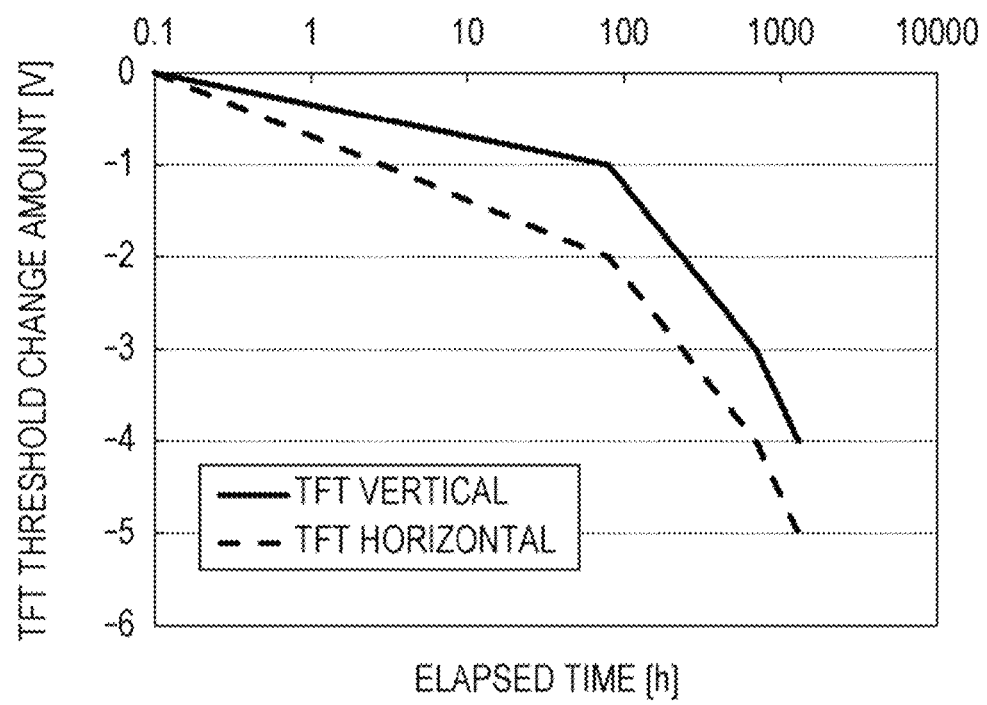
FIG. 18 is a graph illustrating a change in a threshold of a TFT in the TFT vertical structure and the TFT horizontal structure.

FIG. 18 is a graph illustrating a change in the threshold of a TFT in the TFT vertical structure and the TFT horizontal structure. The horizontal axis represents an elapsed time of an operation experiment and the vertical axis represents a TFT threshold change amount (V). As understood from FIG. 18, the change in the threshold can be set to be small in the TFT vertical structure. This is considered because the gate electrode extends in the vertical direction in the edge of the channel region on the gate electrode, and thus backlight light can be efficiently blocked by a gate electrode in the edge of the channel region as result obtained.

Further, as described above, in the TFT vertical structure, it is possible to reduce the pixel pitch P1 in the row direction more than in the TFT horizontal structure. In the TFT vertical structure, the pixel pitch P1 is decided only under the restriction of the size of the contact hole. Therefore, by decreasing the width of the underlying layer of the contact hole 22a, it is possible to reduce the pixel pitch P1 more efficiently. Even in the TFT horizontal structure, by decreasing the width of the underlying layer, it is possible to obtain the advantageous effect of decreasing the pixel pitch P1. However, the contact hole and the channel region are arranged in the row direction and the pixel pitch P1 is also restricted to the width of the channel region. Therefore, the pixel pitch P1 is greater than in the TFT vertical structure.

By adopting the TFT vertical structure and forming the contact hole (for example, a contact hole which underlies the metal oxide layer) which has the light transmission region T, it is possible to improve an aperture ratio more efficiently than a case in which the TFT horizontal structure is adopted. In a display apparatus, a light-shielding layer of a color filter is generally disposed on a pixel TFT to suppress a change in the characteristics of the pixel TFT due to incidence of external light. In the case of the TFT horizontal structure, most of the contact hole is shielded from light by the light-shielding layer of the color filter. Therefore, the advantageous effect of improving the pixel aperture ratio by the light transmission region T of the contact hole is suppressed. In the case of the TFT vertical structure, however, the width of the light-shielding layer of the color filter in the column direction can be narrowed, and thus it is possible to considerably improve the pixel aperture ratio. Although not illustrated, for example, ½ or more of the light transmission region T of the contact hole is preferably located in a region which is not shielded from light by the light-shielding layer of the color filter. Thus, it is possible to improve the pixel aperture ratio more efficiently.

<Examination of Formation Condition of Contact Hole 22a>

In the semiconductor device according to the first to fourth embodiments, by controlling the inclination angle α of the contact hole 22a and the overetching amount dt of the gate insulation layer 14, it is possible to reduce the light leakage in the contact portion more efficiently.

The present inventors have examined and found that the inclination angle α of the contact hole 22a and the overetching amount dt of the gate insulation layer 14 can be controlled according to etching conditions at the time of forming the contact hole 22a and a material of each layer. Hereinafter, a part of the examination result by the present inventors will be described.

Here, dry etching was performed under 3 kinds of different conditions by switching an etching gas and an etching time to form the contact hole in the inter-layer insulation layer and the inclination angle α and the overetching amount dt were obtained. The inter-layer insulation layer and the material of the gate insulation layer of a sample used for the examination are as follows;

inter-layer insulation upper layer: SiN film (thickness: 150 nm);

lower layer: $SiO_2$ film (thickness: 300 nm);

gate insulation layer upper layer: $SiO_2$ film (thickness: 50 nm); and lower layer: SiN film (thickness: 325 nm).

A result obtained inspecting the inclination angle α of the contact hole 22a and the overetching amount dt of the gate insulation layer 14 in a case in which the contact hole is formed under three different conditions is shown in Table 1.

TABLE 1

| | Condition 1 | Condition 2 | Condition 3 |
|---|---|---|---|
| Inclination angle α of side surface of contact hole (°) | 44 | 19 | 12 |
| Etching amount of gate insulation layer (nm) | 220 | 340 | 400 |

From this result, it can be understood that the inclination angle α of the side surface of the contact hole can be decreased under the etching conditions in the case of dry etching. For example, the inclination angle α can be decreased to be equal to or less than 15° (here, 12°). On the other hand, in this case, it can be understood that the etching amount of the gate insulation layer increases.

Accordingly, it can be confirmed that the tapered shape of the contact hole and the etching amount of the gate insulation layer can be controlled by controlling the etching conditions.

The examination was carried out under the condition that the etching rate of the SiN film is greater than the etching rate of the SiO$_2$ film. Therefore, not only the upper layer of the gate insulation layer but also a part of the lower layer (SiN layer) are etched, and thus the overetching amount is increased. When the condition that the etching rate of the SiO$_2$ film is increased, the overetching amount can be suppressed to be equal to or less than, for example, the thickness of the upper layer of the gate insulation layer.

INDUSTRIAL APPLICABILITY

The embodiments of the invention can be broadly applied to various semiconductor devices that has oxide semiconductor TFTs. For example, the embodiments are also applied to a circuit substrate such as an active matrix substrate, a liquid crystal display apparatus, display apparatuses such as an organic electro luminescence (EL) display apparatus, an inorganic electroluminescence display apparatus, and an MEMS display apparatus, an imaging apparatus such as an image sensor apparatus, and electronic apparatuses such as an image input apparatus, a fingerprint reading apparatus, and a semiconductor memory. In particular, the embodiments are appropriately applied to a high precise liquid crystal display apparatus.

REFERENCE SIGNS LIST

10 OXIDE SEMICONDUCTOR TFT
11 SUBSTRATE
12 GATE ELECTRODE
14 GATE INSULATION LAYER
16 METAL OXIDE LAYER
16a FIRST PORTION OF METAL OXIDE LAYER
16b SECOND PORTION OF METAL OXIDE LAYER
18s SOURCE ELECTRODE
18d DRAIN ELECTRODE
22 INTER-LAYER INSULAnoN LAYER
22a CONTACT HOLE
24 TRANSPARENT CONDUCTIVE LAYER (LOWER TRANSPARENT CONDUCTIVE LAYER)
26 INSULATION LAYER
28 UPPER TRANSPARENT CONDUCTIVE LAYER
100A, 100B, 200, 308,400 SEMICONDUCTOR DEVICE (TFT SUBSTRATE)
500 DISPLAY APPARATUS

The invention claimed is:

1. A semiconductor device comprising:
a substrate;
a plurality of pixels that are arrayed in a matrix form in first and second directions on the substrate;
a plurality of gate wirings that extend in the first direction; and
a plurality of source wirings that extend in the second direction,
wherein each of the plurality of pixels includes
a thin film transistor that is held by the substrate and includes a gate electrode, a gate insulation layer covering the gate electrode, a metal oxide layer formed on the gate insulation layer, and a source electrode and a drain electrode disposed to come into contact with an upper surface of the metal oxide layer,
an inter-layer insulation layer that covers the thin film transistor, and
a transparent conductive layer that is formed on the inter-layer insulation layer,
wherein the gate electrode is connected to one of the plurality of gate wirings and the source electrode is connected to one of the plurality of source wirings,
wherein the metal oxide layer includes a first portion overlapping the gate electrode via the gate insulation layer and a second portion not overlapping the gate electrode, and the first portion includes a portion located between the source electrode and the drain electrode when viewed in a normal direction of the substrate,
wherein the inter-layer insulation layer has a contact hole disposed to overlap a part of the drain electrode when viewed in the normal direction of the substrate,
wherein the transparent conductive layer comes into contact with the drain electrode and the gate insulation layer in the contact hole, and
wherein when viewed in the normal direction of the substrate, both of a width of a portion of the drain electrode overlapping with the transparent conductive layer in the first direction and a width of the second portion of the metal oxide layer in the first direction are less than a width of the contact hole in the first direction.

2. The semiconductor device according to claim 1, wherein when viewed in the normal direction of the substrate, the source electrode, the first portion of the metal oxide layer, the drain electrode, and the contact hole are arrayed in this order in the second direction.

* * * * *